United States Patent [19]

Sanpei et al.

[11] Patent Number: 5,594,625
[45] Date of Patent: Jan. 14, 1997

[54] ELECTRIC APPLIANCE, ITS ASSEMBLING METHOD, AND ITS HOUSING STRUCTURE

[75] Inventors: Kazuo Sanpei; Tatsuo Yamauchi, both of Fukushima-ken, Japan

[73] Assignee: Hitachi Telecom Technologies Ltd., Koriyama, Japan

[21] Appl. No.: 477,615

[22] Filed: Jun. 7, 1995

Related U.S. Application Data

[62] Division of Ser. No. 127,568, Sep. 28, 1993, Pat. No. 5,461,543.

[30] Foreign Application Priority Data

| Feb. 28, 1992 | [JP] | Japan | 4-281095 |
| Sep. 28, 1992 | [JP] | Japan | 4-281094 |
| Sep. 28, 1992 | [JP] | Japan | 4-281096 |
| May 18, 1993 | [JP] | Japan | 5-138922 |

[51] Int. Cl.[6] .................................................. H05K 5/00
[52] U.S. Cl. ........................................................ 361/755
[58] Field of Search .................................. 206/328, 334; 220/4.21, 4.24, 315, 324; 361/725–732, 741–742, 747, 752, 755–759, 796, 800–802

[56] References Cited

U.S. PATENT DOCUMENTS

| 4,226,491 | 10/1980 | Kazama et al. | 339/17 |
| 4,672,510 | 6/1987 | Castner | 361/415 |
| 5,144,533 | 9/1992 | Annett | 361/396 |

*Primary Examiner*—Gregory D. Thompson
*Attorney, Agent, or Firm*—Foley & Lardner

[57] ABSTRACT

An upper case 1 and a lower case 2 are fixed by no screw, so that assemblage workability is improved. An electric appliance can be divided into plastic upper case 1, metal-plate-made lower case 2, and logic package 9 having print substrates. As a result, the electric appliance is easy to waste.

19 Claims, 20 Drawing Sheets

ELECTRIC APPLIANCE, ITS ASSEMBLING METHOD, AND ITS HOUSING STRUCTURE

This application is a Divisional of application Ser. No. 08/127,568, filed Sep. 28. 1993 now U.S. Pat. No. 5,461,546.

BACKGROUND OF THE INVENTION

1. Field of the Invention

The present invention relates to an assembling method of electric appliances, an electric appliance itself, and a housing structure of the electric appliance, such as telephones and facsimiles for carrying out information communication through telephone lines.

2. Description of the Prior Art

According to the conventional electric appliances such as communication terminal apparatus for carrying out information communication by means of telephone lines, the housing of the appliance is made of conductor material such as metal plate as shown in FIG. 26. A logic package (d) is placed in an upper case (a) having a plurality of bosses (c) and a lower case (b) of an L shape and secured there. An indication panel (e) is attached to a front portion of the upper case (a), and a push button (g) is installed on an electric key (f) mounted on the logic package (d).

According to the conventional electric appliances, the upper case (a) is as described above made of metal plate or sheet, so that a number of manufacturing steps are necessary and workability of the appliance assembling is low since the lower case (b) is secured to the upper case (a) through a number of bosses (c) and screws (h).

In addition, conventionally, according to the electric appliances such as communication terminal apparatus and the like for carrying out information communication by means of telephone lines, the push button switch portion is structured as shown in the official gazette of Utility Model Hei 1-142125 by attaching the push button unit to the housing side and then placing a logic package having electric keys mounted thereon in the housing.

As described above, according to electric appliances of the prior art, the push button unit is attached to the housing side, and then the logic package provided with electric keys mounted thereon is contained in the housing in order to structure the push button switch portion, so that it is impossible to confirm or know whether the push button switch portion is completely structured or not until the electric appliance is assembled. The result is poor workability of assembly.

SUMMARY OF THE INVENTION

According to the assembling method of the electric appliances of the present invention, the electric appliance, provided with an upper case having a plurality of logic package holding portions placed on the interior side of left and right side face portions with a regular interval along a front and back direction of the appliance and an upper case side engagement portion, a lower case provided with hook portions formed on the front portions of left and right sides and a lower case side engagement portion, a push button unit, and a logic package, is assembled by installing the push button unit on the logic package, inserting the logic package in the upper case using the logic package holding portion as a guide and securing the logic package to the upper case, hooking the hook portion of the lower case the logic package holding portion placed at the most front position and rotating the lower case to the upper case side in order to make both the cases overlapped, and pushing-down the lower case in order to make the lower case side engagement portion engaged with the upper case side engagement portion.

Additionally, the electric appliance of the present invention has a plastic-made upper case provided with a plurality of logic package holding portion placed on the interiors of the left and the right side face portions at a regular interval along a front and rear direction and an upper case side engagement portion, a lower case made of conducting material provided with hook portions placed on the lower case side engagement portion and the left and the right side front portions, the hook portions being hooked on the most front logic package holding portion and the hook portions being turned to the upper case side and pushed in the upper case resulting in an engagement of the lower case side engagement portion and the upper case side engagement portion, a logic package adapted to be inserted into the upper case using the logic package holding portion as an insertion guide and held there, and a push button unit detachably installed in the logic package.

Additionally, the housing structure of the electric appliance of the present invention has a plurality of logic package holding portions placed at the interiors of the left and the right side face portions at a regular interval along a front and back direction and an upper case side engagement portion, and a lower case provided with hook portions placed on the lower case side engagement portion and the left and the right side front portions, the hook portions being adapted to be hooked on the most front logic package holding portion and the hook portions being adapted to rotate to the upper case side pushed in the upper case resulting in an engagement of the lower case side engagement portion and the upper case side engagement portion.

Also, concerning the housing structure of the electric appliance according to one embodiment of the present invention the logic package holding portion formed on the inner faces of the left and the right side face portions of the upper case has a horizontal groove through which a side edge portion of the logic package is inserted. The upper case side engagement portion has a rear-protruded engagement portion formed at a lower side portion of the rear logic package holding portion, and the lower case side engagement portion is an engagement hole portion adapted to engage with the engagement portion when the lower case is applied to the upper case, the lower case side engagement portion being formed on a L shape bent portion of a rear face portion of the lower case. The hook portions are L shape protrusions having notched portions to be hooked on the front logic package holding portion.

The electric appliance of the present invention has a liquid crystal indicator containing portion for containing a liquid crystal indicator placed at a front face of the case. The liquid crystal indicator containing portion is made of opening portions, wherein stepped portions are formed at outside peripheral portions of the opening portions, and protrusions are placed above and below the opening portions. The liquid crystal indicator fits into the stepped portion of the opening portion, and the upper portion of the liquid crystal indicator is engaged with the upper protrusions. Also, the lower portion of the indicator engages with the lower protrusions, and a rear side portion of the liquid crystal indication is held by a holding member placed on the logic package.

Additionally, the holding member of the electric appliance may have some elasticity for holding a rear face portion of the liquid crystal indicator.

According to another embodiment of the present invention, the case of the electric appliance has a push button switch installation portion in which the push button switch portion is installed. The logic package has a plurality of electric keys formed on its front edge portion and an engagement hole portion. The push button unit has a plurality of push buttons arranged in the left position and the right position, respectively of the front face portion of the case main body of the push button unit. These push buttons are attached to the case main body through resilient push button connection pieces, and the case main body has an engagement portion adapted to engage with an engagement hole portion of the logic package. The engagement portion engages with the engagement hole portion of the logic package in order to install the push button unit on the front edge portion of the logic package, wherein the front ends of the electric keys abut against the back faces of the push buttons supporting the push button switch portion, such that pushing-in of the logic package mounts the push button switch portion on the push button switch installation portion of the case.

According to another embodiment the case main body of the push button unit has pillar portions positioned at the rear of and between the push buttons.

In addition, the push button unit installation portion has oval holes for accommodating push buttons and additional holes arranged above and below the oval holes. The front face portion of the case main body of the push button unit has protrusions adapted to engage with the holes of the upper case. The engagement portions is structured by grooves accommodating the front end portion of the logic package, by cantilever-like engagement pieces, and by protrusions formed at front end portions of the engagement pieces so as to engage with the engagement hole portion of the logic package and to have slanted front faces.

Further, the push button unit installation portion is structured with oval holes accommodating push buttons, a plurality of protrusions formed on upper and lower face portions of the oval holes, and additional holes placed above and below the oval holes. The push button unit are structured with a plurality of push buttons arranged at the left and the right positions on the front face portion of the case main body of the push button unit. These push buttons are attached to the case main body through resilient push button connection pieces, and the push buttons have stopper portions adapted to come in contact with edge portions of the oval holes. The case main body has an engagement portion adapted to engage with an engagement hole-portion of the logic package.

In addition, the electric appliance of the present invention has a plastic-made upper case provided with a plurality of logic package holding portions placed on the interior of the left and the right side face portions at a regular interval along front and rear direction and an upper case side engagement portion; a conductive lower case having a lower case side engagement portion and the left and the right side front hooks adapted to hook onto the most front logic package holding portions, to rotate to the upper case side, to overlap on the upper case, and to push into the upper case in order to engage the lower case side engagement portion with the upper case side engagement portion; and a logic package adapted to insert into the upper case using the logic package holding portion as an insertion guide and be secured there. The logic package has an interface connector and a power switch. A package holder having power cable mounted and secured thereto is removed to make a space on which an earth terminal is mounted. A rear face portion of the lower case has a notch to which an insulator bushing is removably attached. The power cable passes through the insulator bushing.

Consequently, it is the first purpose of the present invention to provide an assembling method of an electric appliance of easy and improved workability since the housing structure of the appliance uses no screws.

It is the second purpose of the present invention to provide an electric appliance provided with an upper case, a lower case, and a logic package, which are easily disassembled and divided into respective kinds of material making disposal of the appliance easy.

Also, it is the third purpose of the present invention to provide a housing structure of the electric appliance, which does not use any screw to assemble thereby facilitating assembling and disassembling of the structure.

It is the fourth purpose of the present invention to provide a housing structure of improved assembling and disassembling workability, wherein a side edge portion of the logic package is inserted and pushed into grooves of the logic package holding portion, so that it is easy to assemble the logic package onto the upper case, and wherein L shape protrusions of the hook are hooked on the front logic package holding portion and engagement hole portion of the lower case side engagement portion in order to assemble the upper and the lower cases.

It is the fifth purpose of the present invention to provide an electric appliance of improved assemblage workability which use no securing screw of liquid crystal indicators contrary to the conventional securing mechanism.

Also, it is the sixth purpose of the present invention to provide an electric appliance which has a liquid crystal indicator easily secured without use of screws, but which can absorb any shock of the liquid crystal indicator generated while handling of the electric appliance.

It is the seventh purpose of the present invention to provide an electric appliance of improved assemblage workability since it is possible to confirm whether the structure of the push button switch portion is complete after the push button switch portion is assembled but before the electric appliance is wholly assembled.

In addition, it is the eighth purpose of the present invention to provide an electric appliance of high quality with which it is impossible to see the interior of the electric appliance through gaps between the push buttons, with which leakage of any light beam from the interior is prevented.

It is the ninth purpose of the present invention to provide an electric appliance in which positional relationship between the push buttons and the electric keys can be settled, so that it is easy to structure the push button switch portion.

It is the tenth purpose of the present invention to provide an electric appliance in which the push buttons are prevented from being mutually contacted to each other during operation of the push button switch portion, and top ends of the push buttons are prevented from being uneven in height to improve operability of the push button switch portion.

It is the eleventh purpose of the present invention to provide an electric appliance which does not require use of screws for the housing structure thereby making assemblage of the appliance easy and assemblage workability improved. Also, it is possible to make number of interfaces to be mounted on the logic package increase thereby miniaturizing the hole structure and simplifying the assemblage and disassemblage of the appliance.

The characteristics of the electric appliance according to the present invention will be made apparent from the reading of the following description with reference to the accompanying drawings.

DESCRIPTION OF THE PREFERRED EMBODIMENT

The electric appliance according to the present invention is structured with a plastic-made upper case 1, a metal-made lower case, indication panel 3, push button unit 4, and logic packages 9 and 10.

Figure 1:
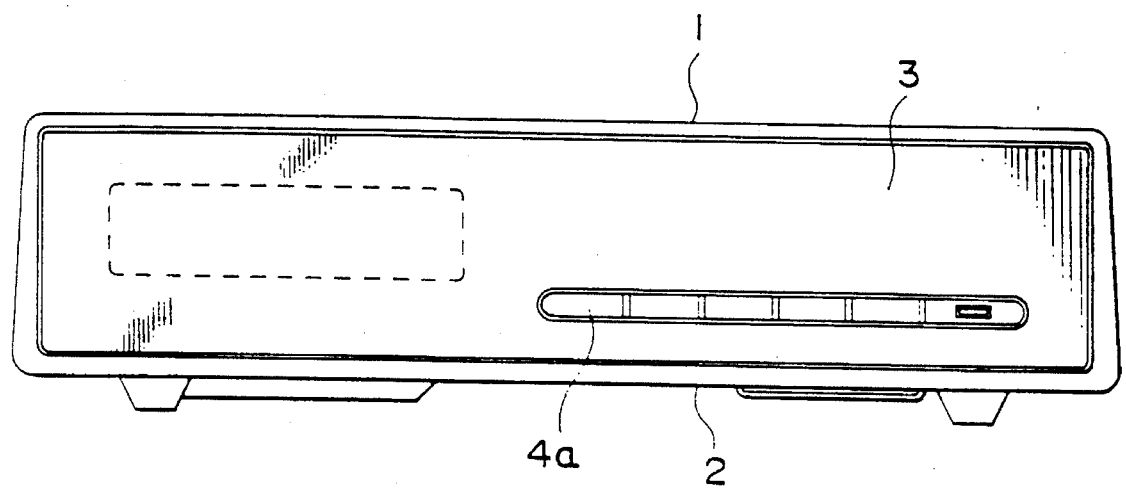
FIG. 1 is a front view of the electric appliance concerning an embodiment of the present invention.
Figure 2:
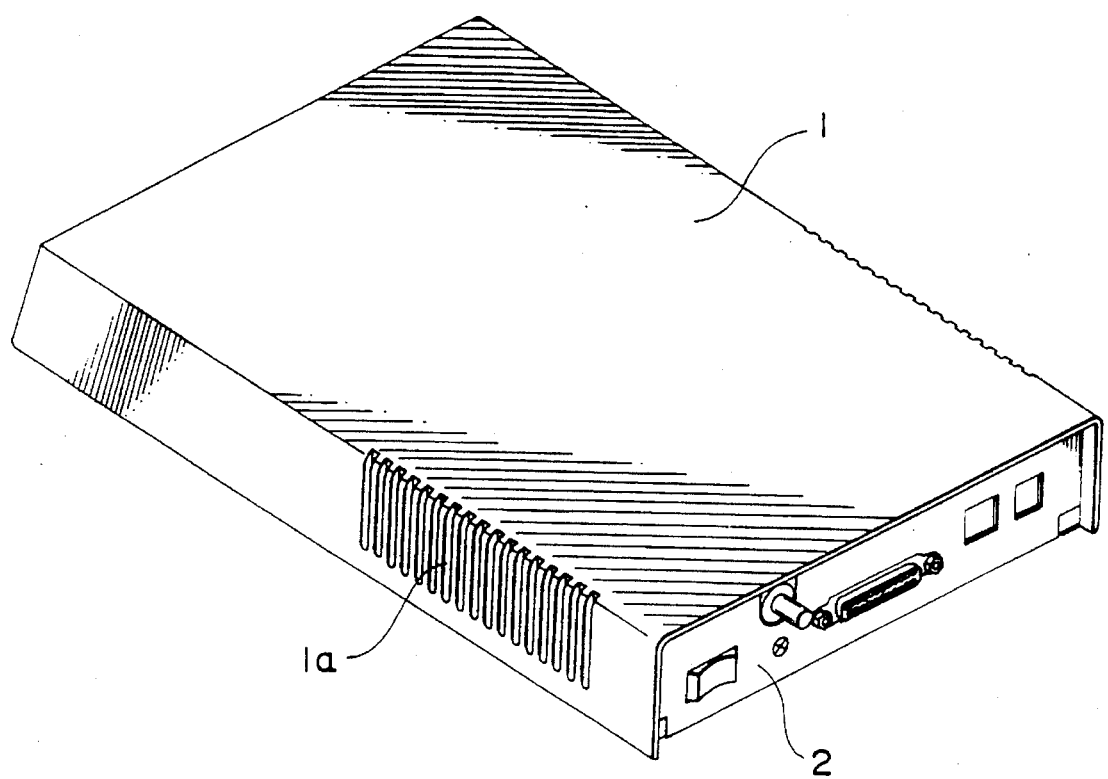
FIG. 2 is a perspective view of the embodiment above.
Figure 3:
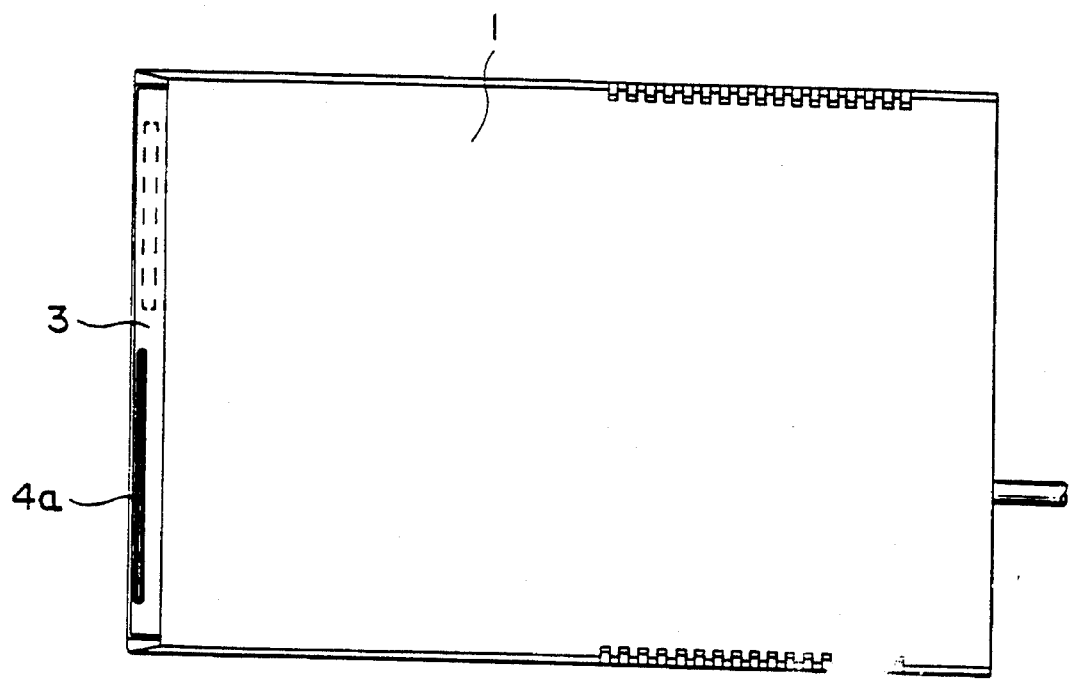
FIG. 3 is a plane view of the electric appliance.
Figure 4:
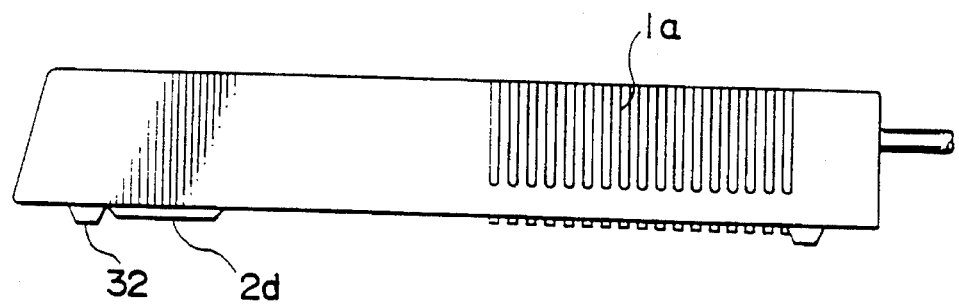
FIG. 4 is a right side elevation of the electric appliance.
Figure 5:
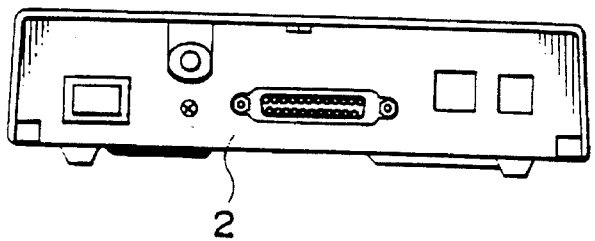
FIG. 5 is a rear view of the electric appliance.
Figure 6:
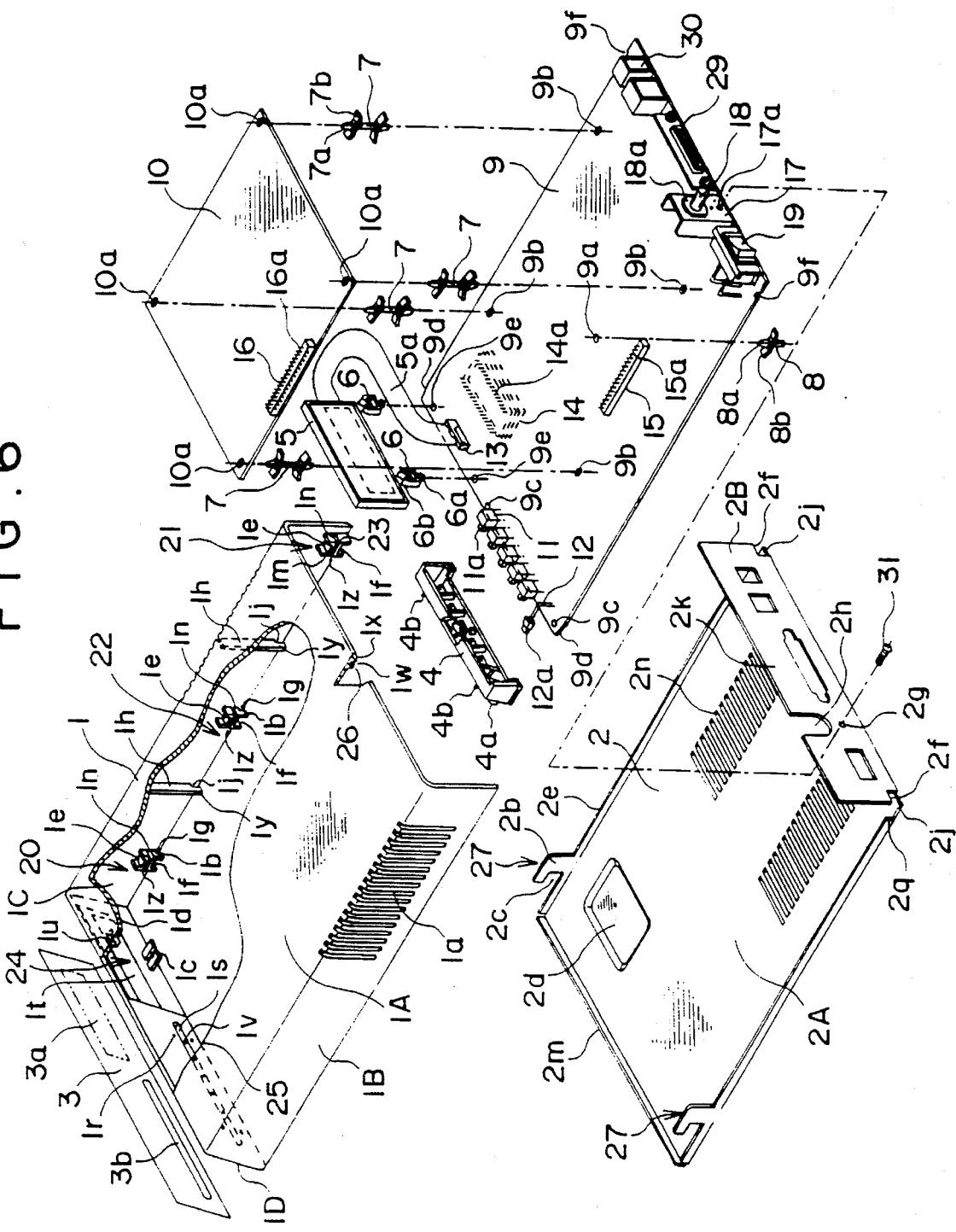
FIG. 6 is an exploded perspective view of the electric appliance.
Figure 7:
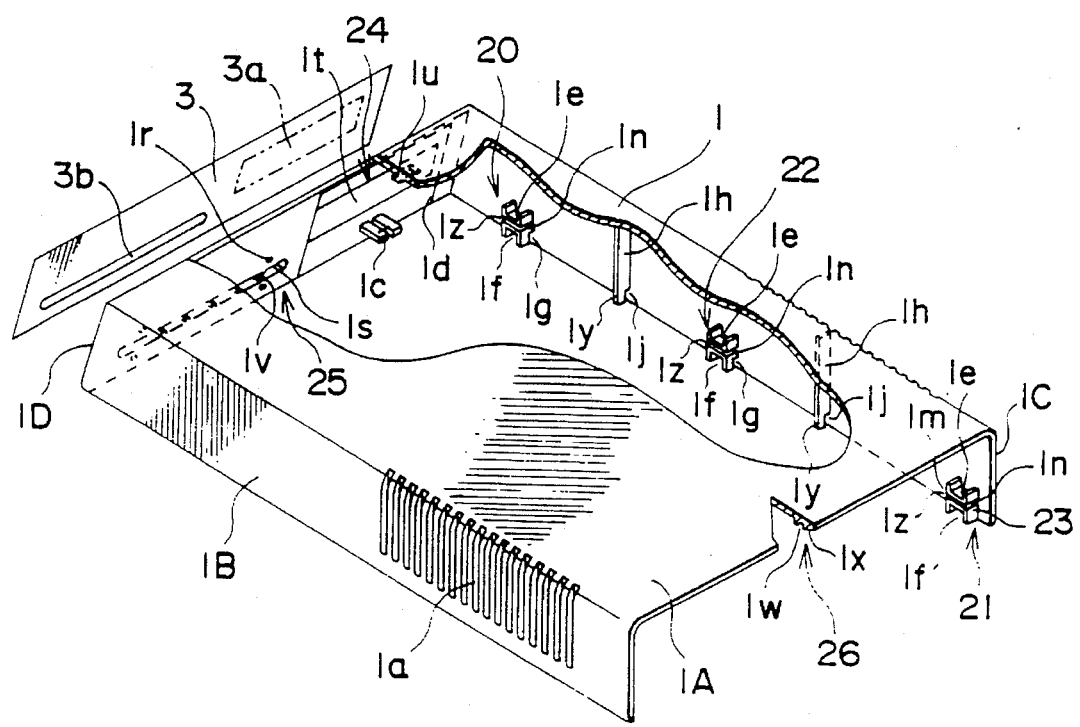
FIG. 7 is a perspective view of the upper case of the appliance.

As shown in FIG. 7, the upper case 1 has an upper face portion 1A, left and right side face portions 1B, 1C and a front face portion 1D, but no rear face portion. The front face portion 1D is a slanted face inclined downward.

The left side portion 1B has heat radiation holes 1a and the left and the right side face portions 1B and 1C have logic package holding portions 20, 21, and 22, respectively so formed at front, rear,-and center positions of the inner face portions of the side face portions as to protrude from the upper case 1.

Figure 16:
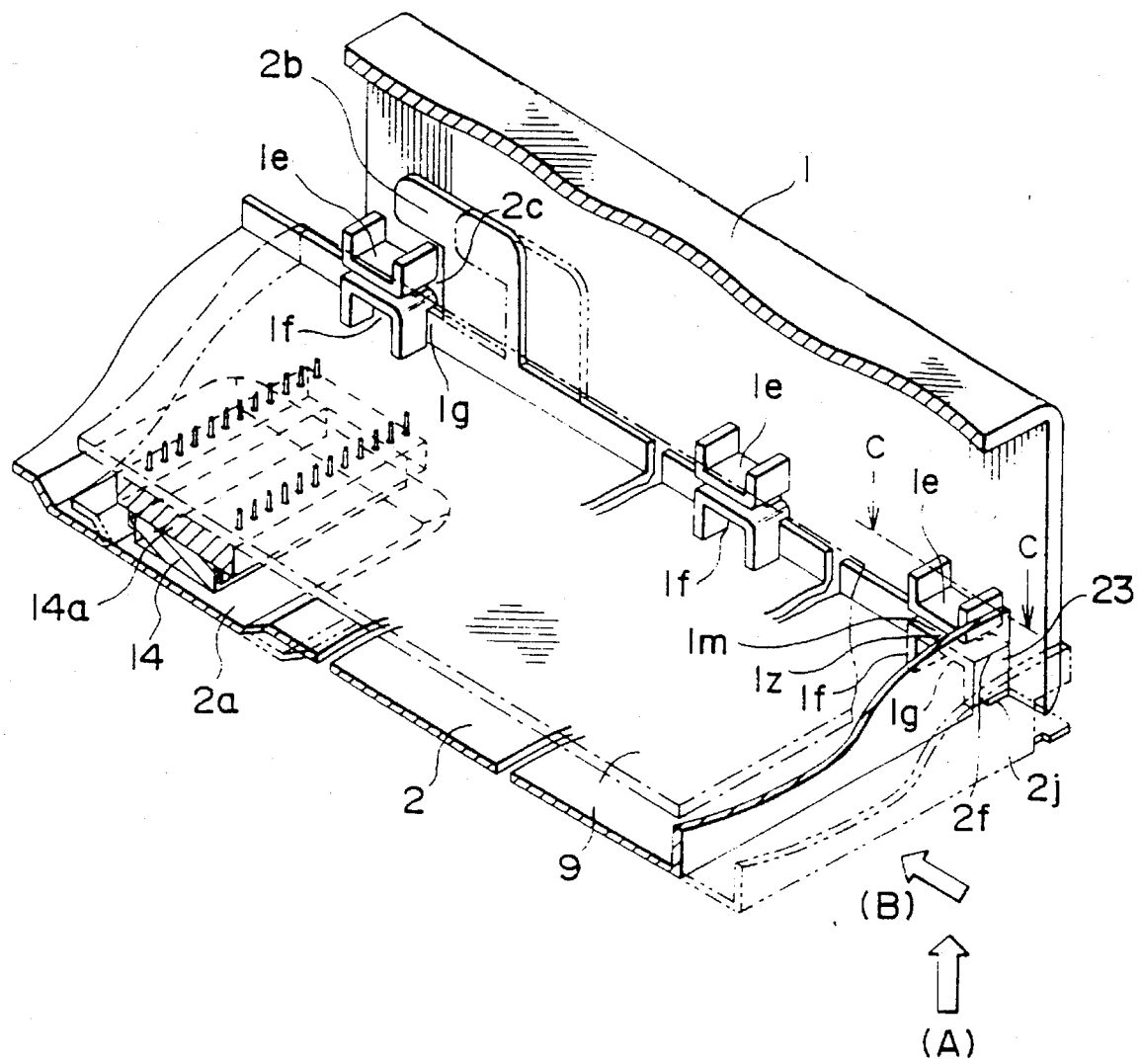
FIG. 16 is a perspective showing engagement condition of the upper case and lower case.
Figure 17:
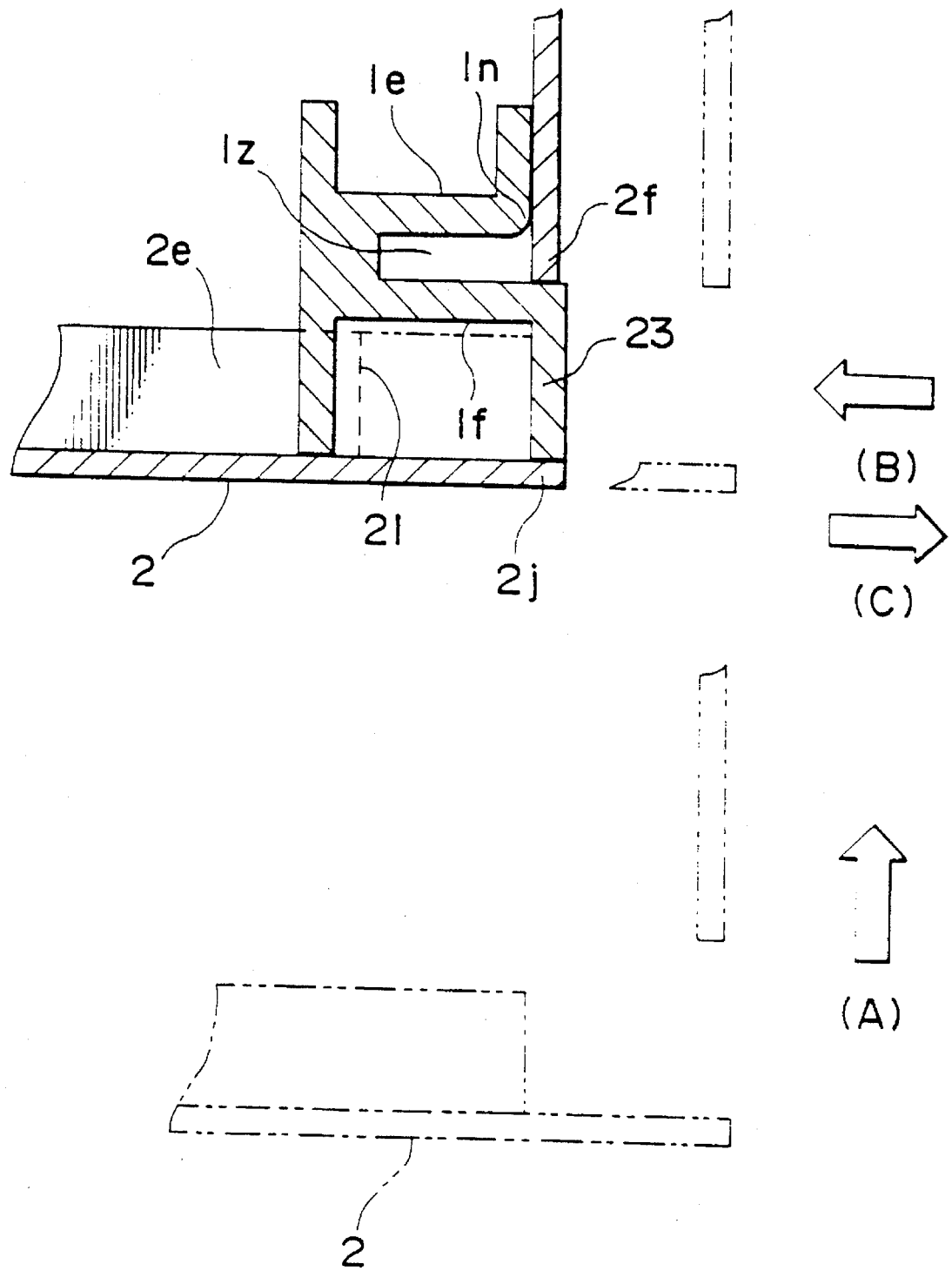
FIG. 17 is a section taken along line 17—17 shown in FIG. 16.
Figure 21:
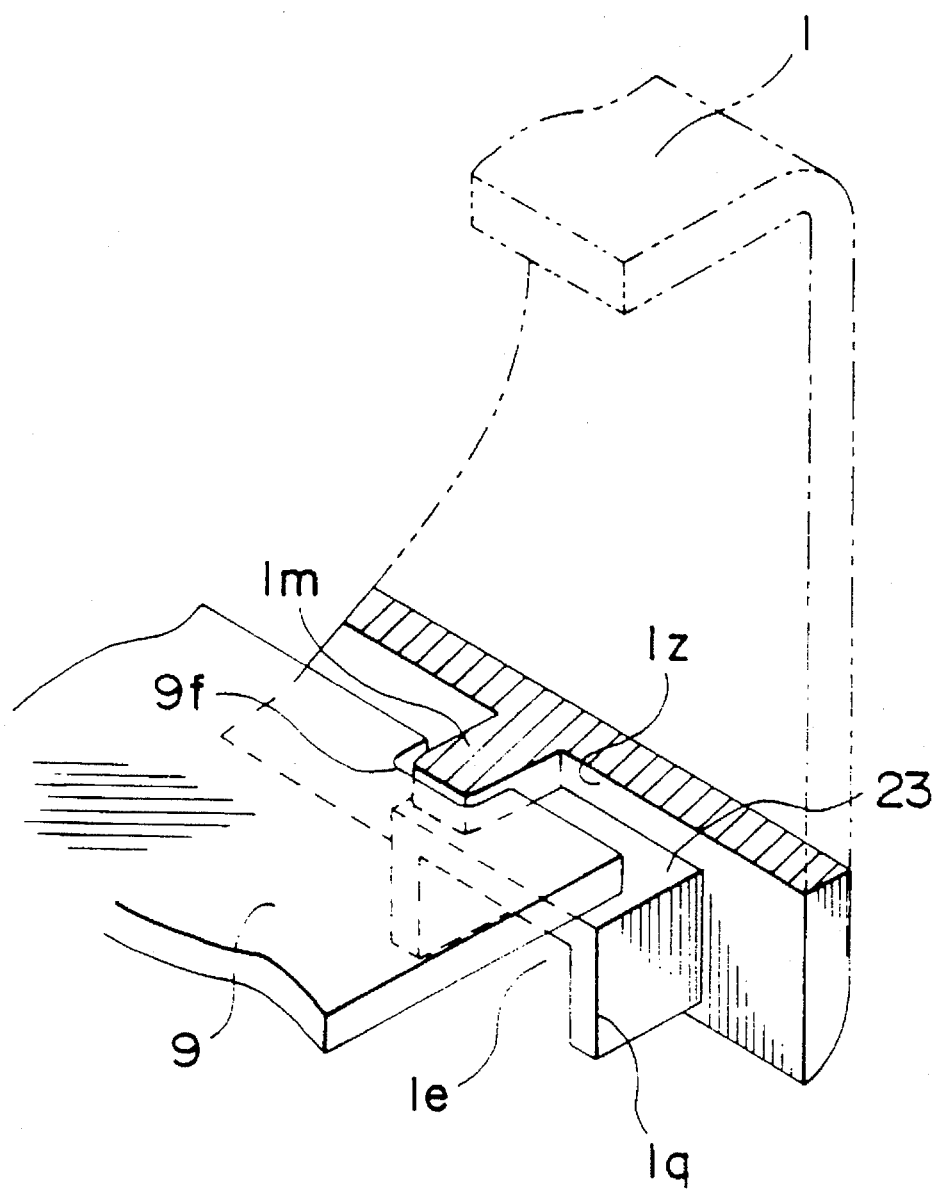
FIG. 21 is a section taken along line 21—21 in FIG. 20.

The front and central logic package holding portions 20 and 22 have the same structure. They are structured or combined by combining both the upper and the lower ⊐ shape protrusions 1e and if back to back leaving a guide groove 1z between them, and leaving an insertion groove 1g between the lower ⊐ shape protrusion 1f and inner face portions of the left and the right side face portions 1B and 1C. The rear side logic package holding portion 21 is assembled as shown in FIGS. 7, 16, and 17 by combining the upper and the lower ⊐ shape protrusions 1e and 1f back to back and leaving the guide groove 1z between them and the insertion groove 1g between the lower ⊐ shape protrusion 1f and the inner face portions of the left and the right side face portions 1B and 1C, then protruding a rear portion of the lower ⊐ shape protrusion if rearward from the upper ⊐ shape protrusion 1e forming a protruded or stepped portion of an engagement portion 23 for the upper case side engagement portion, and forming an engagement protrusion 1m as shown in FIG. 21 at the front portion of the guide groove 1z so as to engage with the notch 9f of the logic package 9.

The inner face portions of the left and the right side face portions 1B and 1C have front and rear longitudinal ribs 1h and these longitudinal ribs 1h have lower ribs 1y leaving gaps 1j.

A front face portion 1D of the upper case 1 has a liquid crystal indicator containing portion 24 securely containing liquid crystal indicators (LCD)5 and a push button unit installation portion 25 on which the push button unit 4 is mounted.

The liquid crystal indicator container or containing portion 24 has a rectangular opening 1t, a stepped portion 1d formed around the circumference of the rectangular opening 1t, and protrusion 1u and 1c placed above and below the opening it sandwiching liquid crystal indicators 5.

Figure 15:
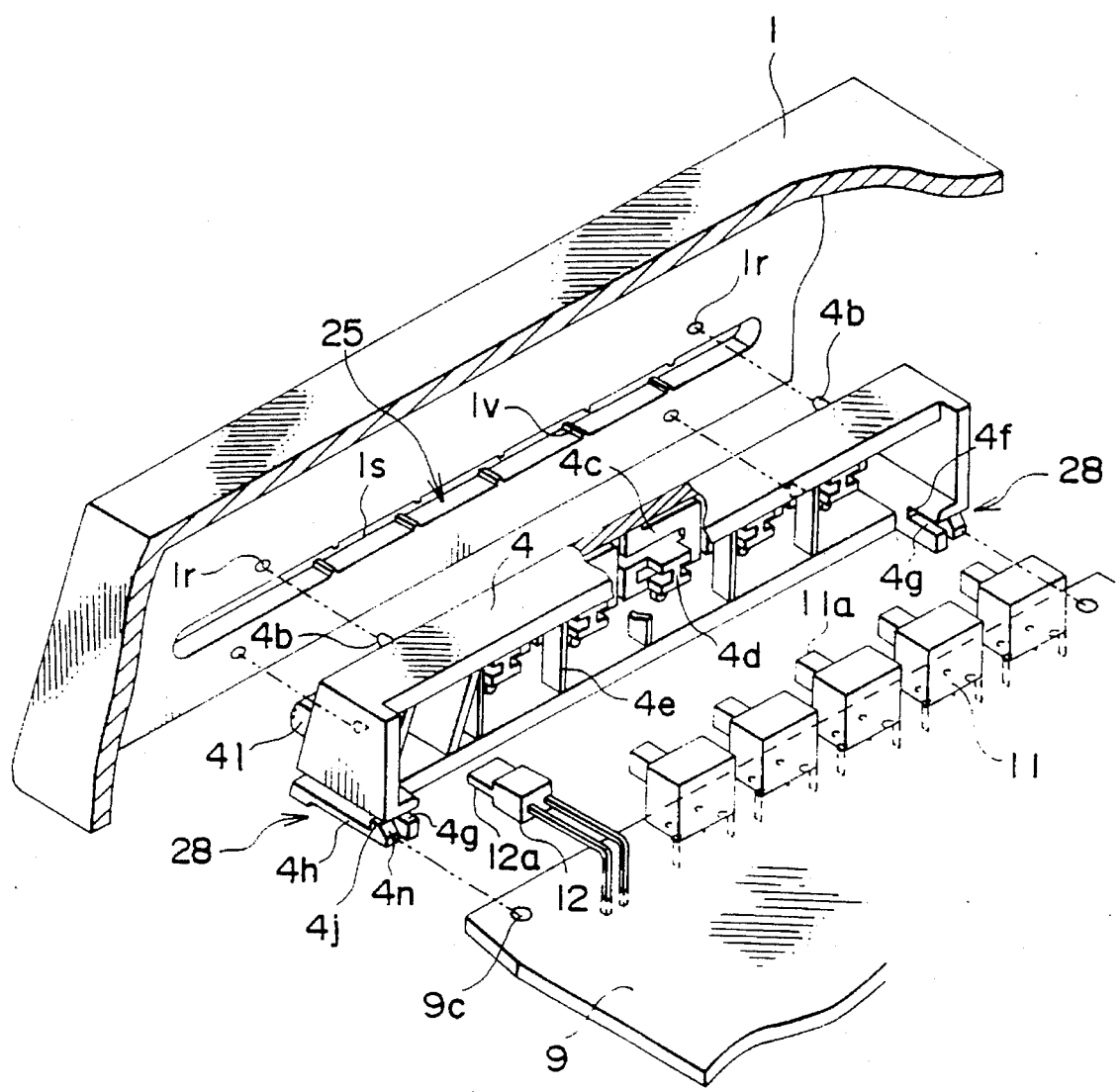
FIG. 15 is an exploded perspective view of the front portion.

As shown in FIG. 7 and FIG. 15, the push button unit installation portion 25 has an oval opening 1s accommodating the push buttons 4a. The oval opening 1s has a plurality of protrusions 1v formed on the upper and the lower face portions at a regular interval and holes 1r formed above and below the oval opening 1s in order to install the push button unit 4.

On the central portion of rear interior of the upper face portion 1A of the upper case 1, there is an engagement portion 26 of the upper case with which an end portion 2k of the rear face portion 2B of the lower case 2 engages. The engagement portion 26 is formed integrally with the upper case 1 and has a slanted face 1x and a groove 1w.

Figure 8:
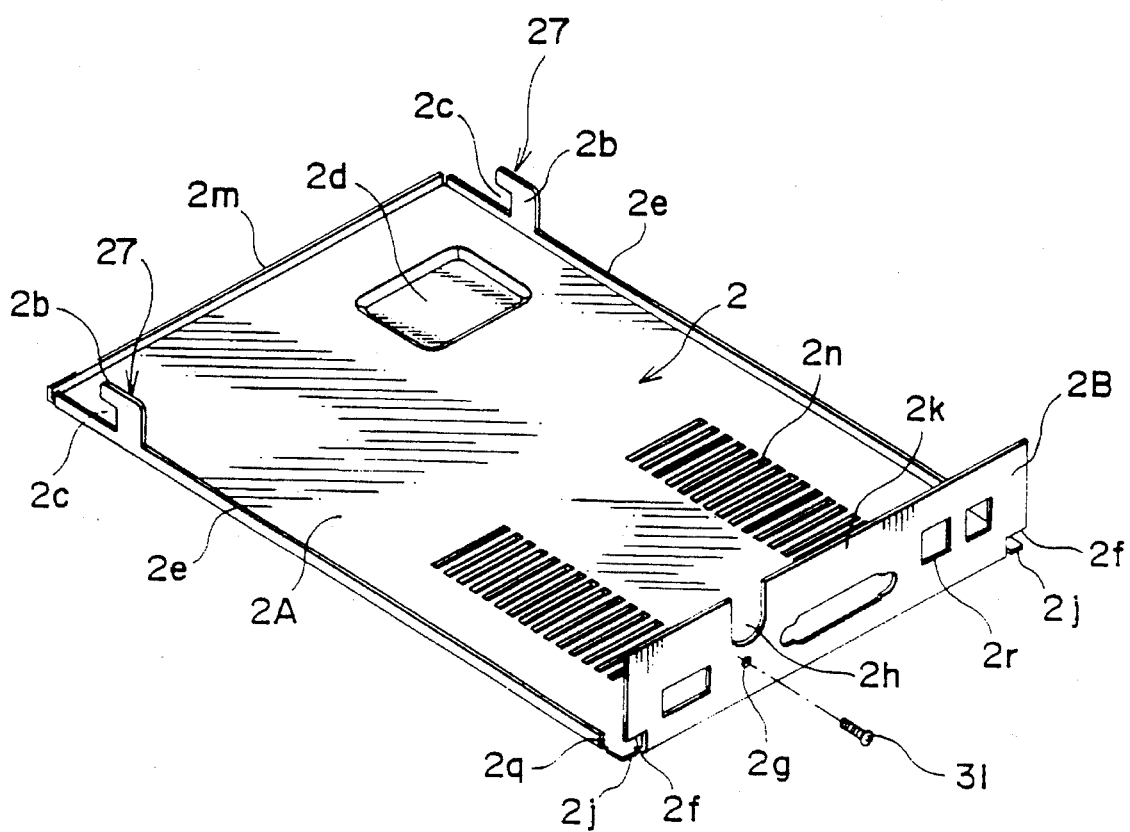
FIG. 8 is a perspective view of the lower case of the appliance.

As shown in FIG. 8, the lower case 2 is integrally made of conductor such as metal plate in order to shield static electricity and noise from entering the electric appliance. The lower case 2 has a bottom portion 2A and rear portion 2B. The bottom portion 2A has a recess 2d for preventing contacting with ROM 14 mounted on the logic package 9 and heat radiating hole 2n.

Also, there are ribs 2e on both the sides of the bottom face portion 2A and these ribs 2e engage with the gaps 1g and 1j of the upper case 1. The hook 27 formed on the front portion of the rib 2e is made of L shape protrusion 2b having a notch 2c. The rib 2e has a flat portion 2j at its rear end and the cut-off portion of the rear end of the rib 2e functions as stopper 2q. The bottom face portion 2A has a rib 2m at its front edge portion.

The rear portion 2B of the lower case 2 has a U shape notch 2h, conductive member hole 2g, plural openings 2r, and a notch 2f facing the stopper 2q formed at the rear end of the rib 2e and functioning as an engagement hole of the lower case 2.

As shown in FIG. 7, the indication panel 3 has an oval hole 3b accommodating the push button 4a of the push button unit 4 and a transparent portion 3a for the liquid crystal indicator 5. As a result, the indicator 5 can be seen from the outside.

As shown in FIGS. 10, 11, 14, and 15, the push button unit 4 has a rectangular case main body 4A and protrusions 4b positioned at four corners of the front face portion of the case main body 4A so as to engage with the holes 1r of the upper case 1. One side of front face of the case main body 4A has accommodation portion 41 for accommodating the front end portion 12a of light emission diode (LED)12 and the accommodation portion 41 has a hole 4m. A plurality of push buttons 4a are arranged in left and right direction on the front side of the case main body 4A. These push buttons 4a are attached to the case main body 4A through resilient connection pieces 4C. A stopper 4k is fixed respectively to the lower side of the push button 4a. Rear face of the push button 4a has a raised portion or stand 4d contacting with a front end 11a of the electric key 11. Pillars 4e are placed in the case main body 4A so as to position at rear of the gaps between the push buttons 4a.

Engagement portions 28 are formed on the left and the right ends of the lower portion of the case main body 4A. These engagement portions 28, respectively have grooves 4g for accommodating front ends of the logic package 9 and a cantilever engagement piece 4h. A front end portion of the engagement piece 4h has a protrusion 4j engageable with the hole 9c of the logic package 9 and the protrusion 4j has a slanted face 4n.

Figure 9:
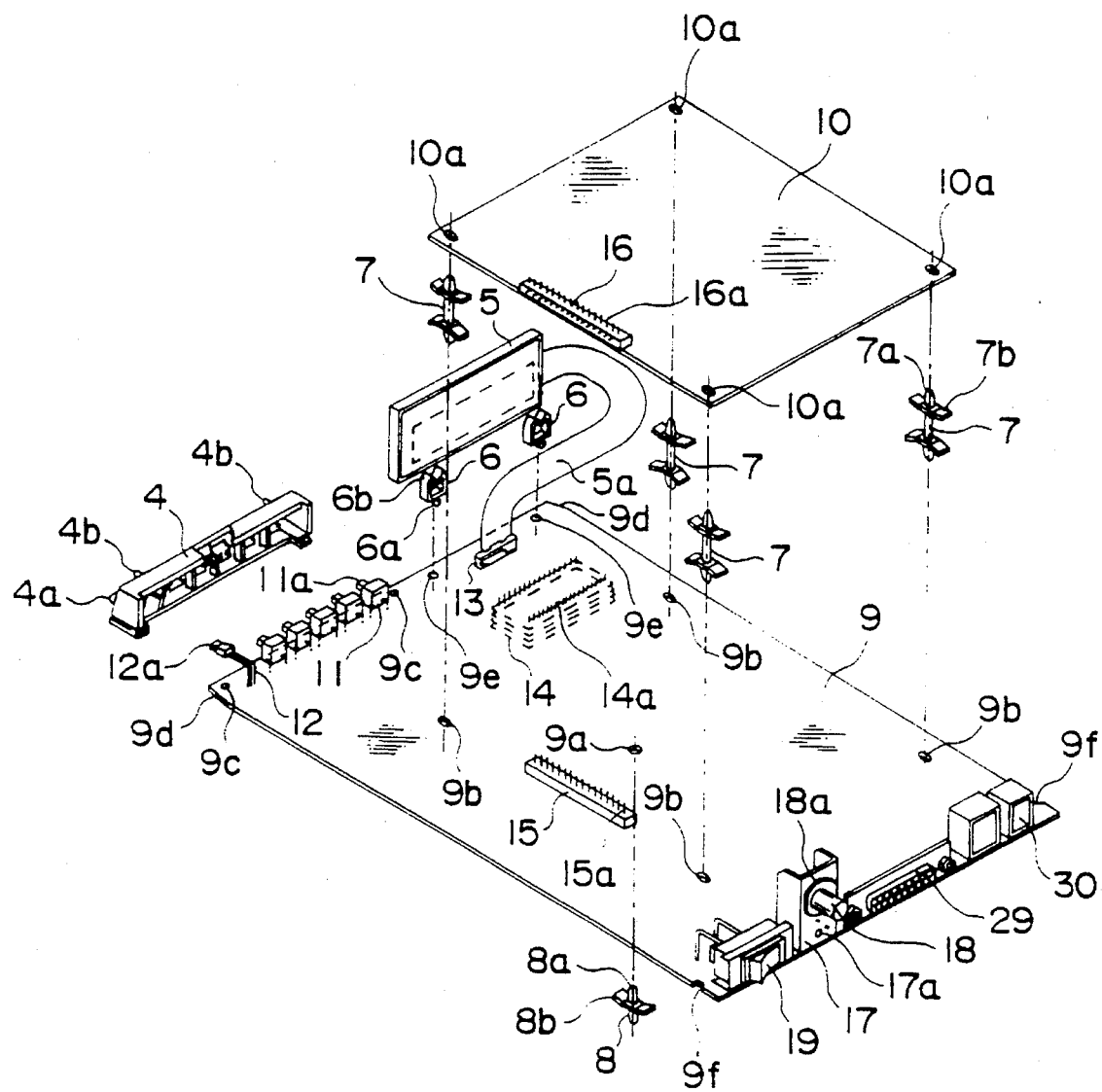
FIG. 9 is a perspective view of the logic package.
Figure 10:
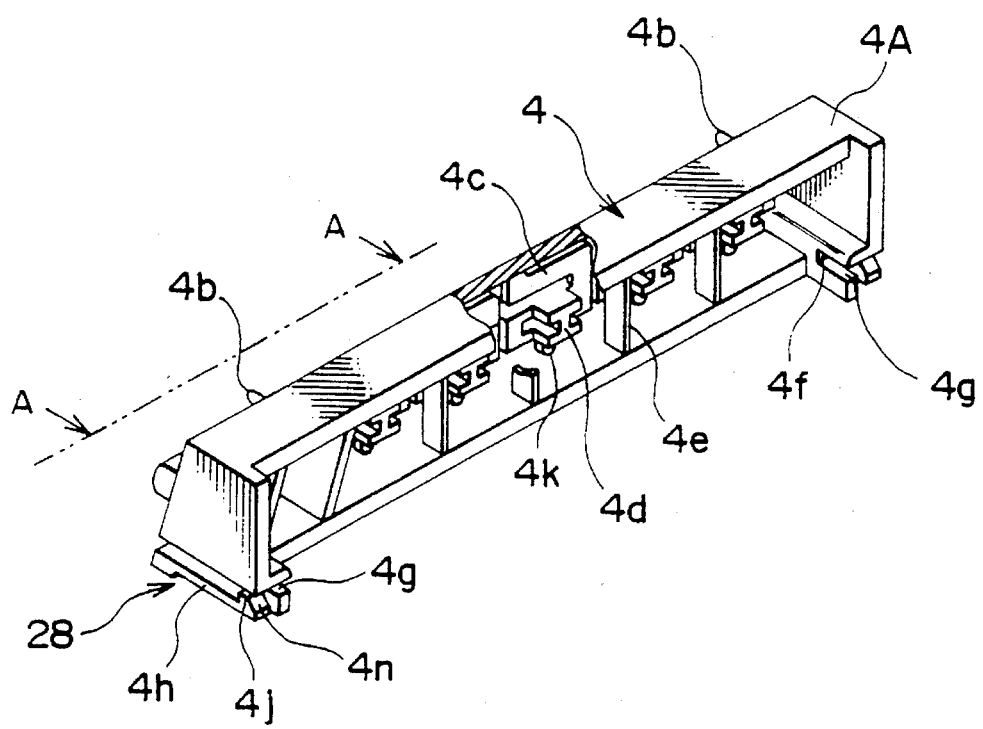
FIG. 10 is a perspective view of the push button unit.

As shown in FIG. 9, the logic package 9 is structured by a print substrate. A connector 15 having part of a terminal 15a connected to an earth is mounted on the logic package 9. A bottom face of the print substrate has a connector 14a and ROM 14. A face portion of the print substrate has a hole 9a on which a spacer 8 is installed and a hole 9b on which a spacer 7 is installed. A front edge portion of the print substrate has a plurality of electric keys 11, light emission diode (LED)12 provided with an indicator 12a, a hole 9c engaging with the push button unit 4, a hole 9e on which a holder 6 is installed, and a connector 13 for connecting the liquid crystal indicator (LCD)5.

A rear edge portion of the print substrate has interface connectors 29, 30, a package holder 17 having a cable holder 18a mounted thereon to secure the power cable 18, and a power switch 19. The package holder 17 has a screw hole 17a formed therein. Front end portions at both sides of the print substrate has a chamferred portion 9d and the rear portion of the print substrate has a notched portion 9f.

The logic package 10 is of a print substrate and upper side portion of the logic package 10 has a connector 16 provided a terminal 16 mounted on part of the connector 16 and connected with an earth. Four corners of the print substrate have four holes 10a and the spacer 7 has a protrusion 7a and a reaf spring 7b. The liquid crystal indicator (LCD)5 has a connection cable 5a.

Next, assembling steps of the electric appliance structured as mentioned above will be explained.

First an indication panel 3 is attached on a front outside of the upper case 1. The logic packages 9 and 10 are secured by inserting the protrusions 7a, on the upper end and the lower end of the spacer 7 which is sandwiched between these packages 9 and 10 in order to make a gap between them preventing electronic parts mounted thereon from interfering with each other, into holes 9b and 10a of each logic packages 9 and 10 with the aid of the leaf spring 7b.

In addition, insertion of the protrusions 7a of the spacer 7 sandwiched between the logic packages 9 and 10 into the holes 9b and 10a makes positioning or position determination of the connectors 15 and 16 of respective logic packages 9, 10 while fitting these connectors easy and results in improved assemblage workability. The protrusion 8a of the spacer 8 is inserted upward through the hole 9a of the logic package 9 and the logic package 9 is secured by function of the leaf spring 8b.

Meanwhile, the front end of the connection cable 5a connected to the liquid crystal indicator (LCD) is secured to a connector 13 mounted on the logic package 9. Protrusions 6a of the holders 6 are inserted into the holes 9e of the logic package.

Figure 14:
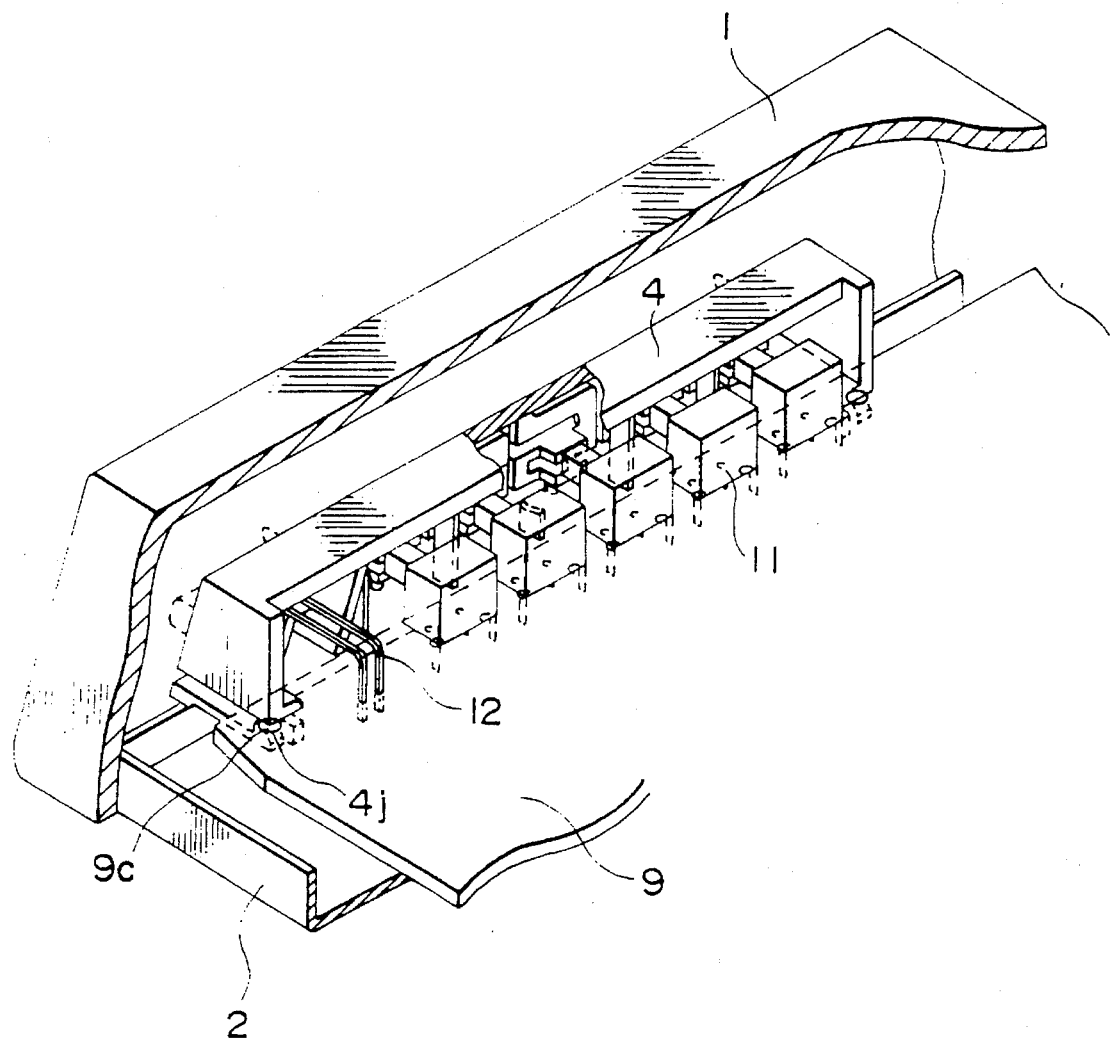
FIG. 14 is a perspective showing a front portion assembled of the electric appliance.

Also, as shown in FIGS. 14 and 15, the push button unit 4 is mounted on the front end of the logic package 9 such that the push button switch is brought together with the electric key 11. That is, the front end of the logic package 9 is inserted into the resilient engagement piece 4h of the push button unit 4 and the bottom face of the case main body 4A, and a protrusion 4j formed on front end of the engagement piece 4h engages with the hole 9c of the logic package 9. As a result, the push button unit 4 is secured to the logic package 9 and front end 11a of the electric key 11 mounted on the logic package 9 contacts the raised portion 4d of the push button 4 to complete the assembly of the push button switch. In addition, the indicator 12a of the light emission diode (LED) mounted on the logic package 9 is accommodated in the hole 4m of the push button unit 4.

Here, it is noted that the slanted face 4n of protrusion 4j of the push button unit 4 makes insertion of the logic package 9 easy and the groove 4g functions as a stopper to the insertion movement of the logic package 9. Additionally, the resilient connection piece 4c of the push button unit 4 makes operation of the push button 4c smooth.

Figure 20:
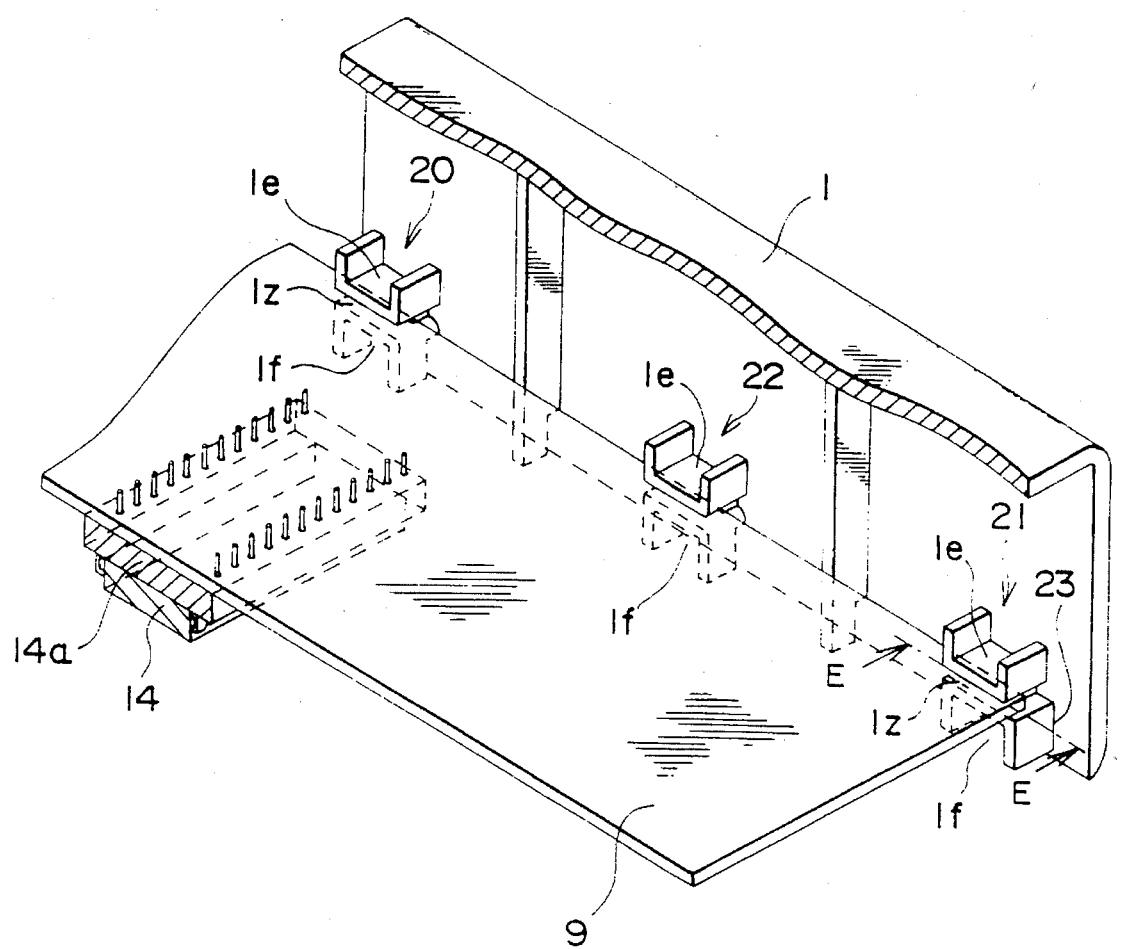
FIG. 20 is a perspective showing installation of the logic package.

Next, as shown in FIGS. 20 and 21, after the push button unit 4, the liquid crystal indicator (LCD)5, holder 6, the logic package 10 fixed through the spacers 7, and the spacers 8 are mounted on the logic package 9, the left and the right side edge portions of the logic package 9 are inserted into the guide groove 1z of the rear side logic packages holding portions 21 placed at the left and the right side portions of the upper case 1. The logic package 9 moves forward from rear of the upper case 1, the left and the right side edge portions of the logic package 9 are sequentially inserted into the guide grooves 1z of the center and the front logic package holding portions 22, 20, and the protrusion 1m of the rear side logic package holding portion 22 engages with the notch 9f formed at the rear portion of the logic package 9 in order to fix the logic package 9 to the upper case 1.

It is noted that the chamferred portion 9d formed on the front portion of the logic package 9 and roundness in of the entrance portion of the guide groove 1z of the logic package holding portions 20, 21, 22 facilitate insertion of the logic package 9.

Figure 18:
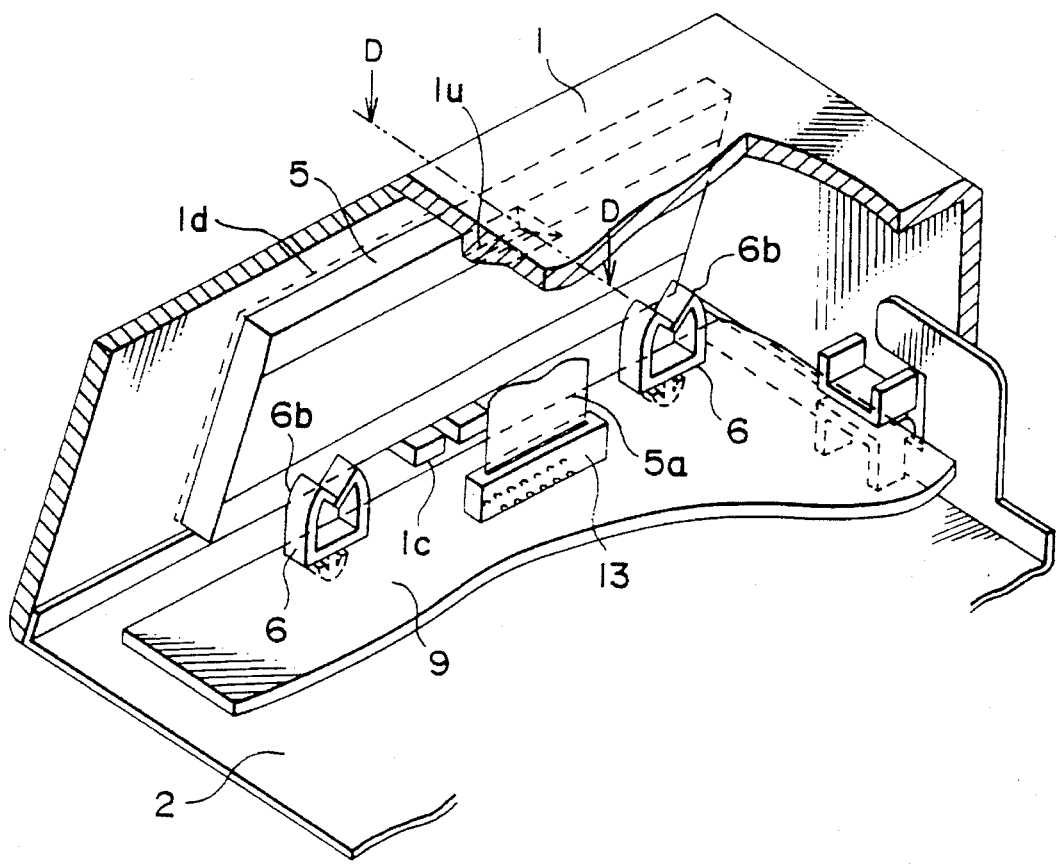
FIG. 18 is a perspective showing a securing condition of liquid crystal indicator, FIG. 19 s a section taken along line 19—19 shown in FIG. 18.
Figure 19:
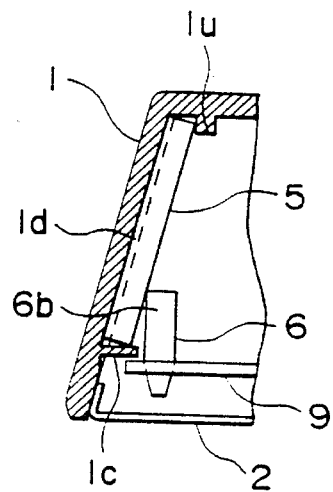

In addition, as shown in FIGS. 18 and 19, upper portion and both sides of the liquid crystal indicator (LCD)5 fit in the stepped portion 1d formed at the front portion of the upper case. In detail, the upper portion of the LCD 5 engages with the protrusion 1u of the upper case 1 and the lower portion of the LCD 5 is mounted on the protrusion 1c. The holder 6 having its lower portion mounted on the logic package 9 restricts rearward movement of the LCD 5 and the resilient fixing portion 6b of the holder 6 absorbs shock of the LCD 5.

As shown in FIGS. 14 and 15, the push button 4a of the push button unit 4 and the accommodation portion 41 for accommodating the LED 12 are received in the oval hole 1s of the upper case 1, and the protrusion 4b of the push button unit 4 engages with the hole 1r of the upper case 1. As a result, the push button unit 4 is secured to the upper case. It is noted that the protrusion 1r of the upper case 1 prevents the push buttons 4a of the push button unit 4 from mutually contacting with each other.

Figure 11:
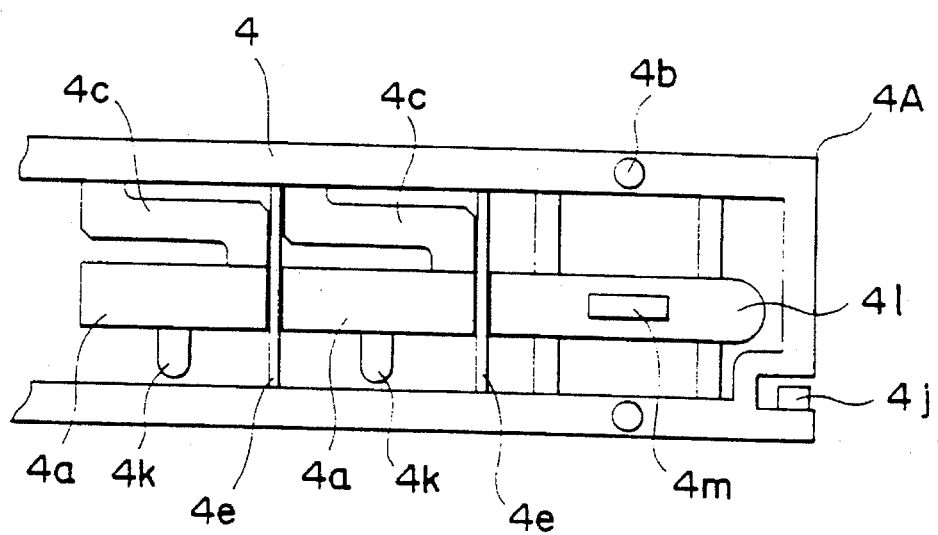
FIG. 11 is a detailed sectional view taken along line 11—11 in FIG. 10.

The pillars 4e of the push button unit 4 prevents the interior of the electric appliance from being seen through a gap or space between the push buttons 4a while the front side of the appliance is seen. Also, as shown in FIGS. 11 and 15, the engagement portions 4k of the push buttons 4a come in contact with the lower edge of the oval hole 1s of the upper case 1 in order to prevent the front ends of the plural push buttons 4a from being uneven.

Next, fixing of the upper case 1 and the lower case 2 will be explained. First, the upper case 1 is turned over making its upper face 1A directed downward. Then the L shape protrusion 2b of the lower case 2 is inserted under the front logic package holding portion 20 of the upper case 1 and secured there. The lower case 2 turns toward the upper case 1 around a fulcrum of the front logic package holding portion 20 so as to overlap the lower case 2 upon the upper case 1, such that the left and the right ribs 2e of the lower case 2 engage with the gaps 1g and 1j of the upper case 1.

Figure 13:
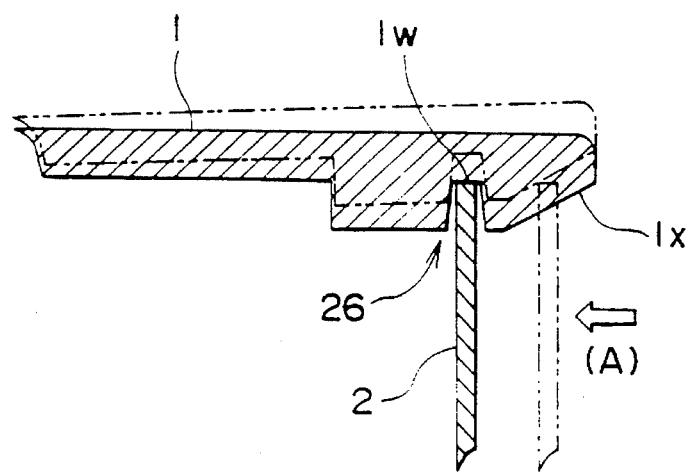
FIG. 13 is a section taken along line 13—13 in FIG. 12.

Next, the lower case 2 is pushed frontward, and end portion 2k of the rear face 2B of the lower case 2 slides along the slanted face 1x of the engagement portion 26 near the rear and center portion of the upper case 1 in order to make the end portion 2k engaged with the groove 1w (see FIG. 13). Then, the lower case 2 is pushed upwardly along an arrow A direction as shown by broken lines in FIGS. 16 and 17. The lower case then slides in an arrow B direction. Such that, an engagement portion 23 at a rear end of the lower ⊐ shape protrusions 1f of the upper case 1 is inserted between the flat portion 2j and the notch 2f of the lower case 2.

When the upper case 1 and the lower case 2 are secured vertically, the logic package holding portion 20 and L shape protrusion 2b are engaged with each other at the front portion of the cases and the engagement portion 23 engages with the rear notch 2f. When the upper case 1 and the lower case 2 are horizontally secured, an engagement at the rear center portion of the cases, or an engagement of the end portion 2k of the rear face portion 2B of the lower case 2 and the engagement portion 26 of the upper case 1 is effectuated.

Figure 12:
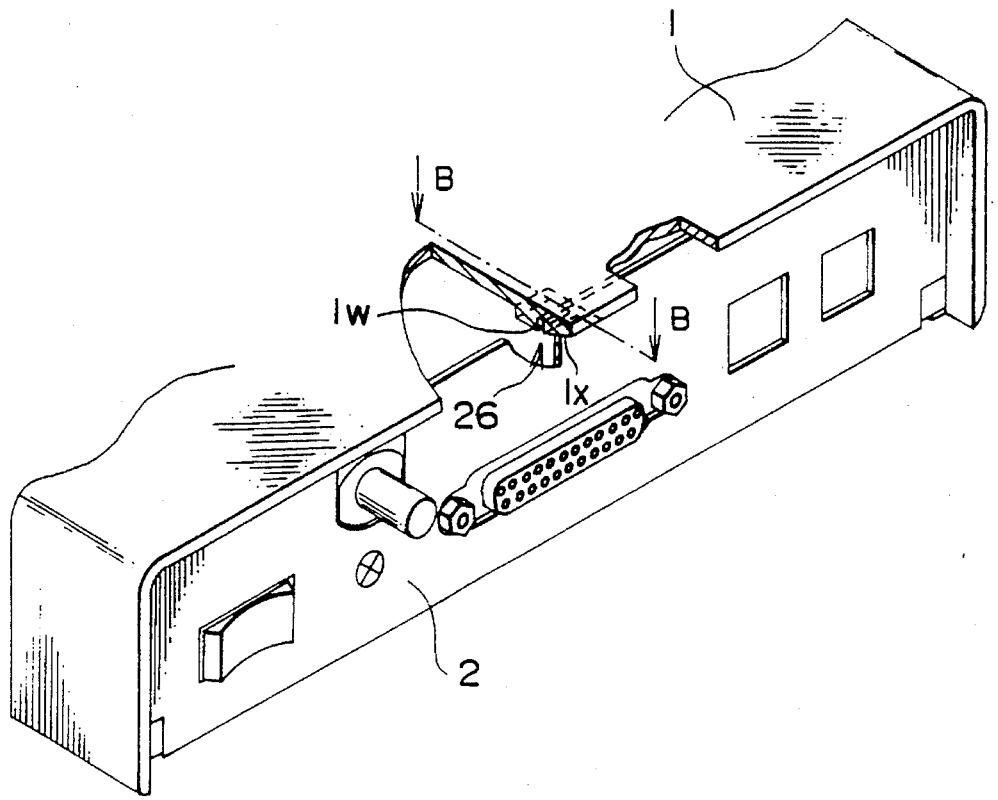
FIG. 12 is a perspective depicting rear portion engagement condition of the electric appliance.

It is noted that, as shown in FIGS. 12 and 13, the slanted face 1x of the upper case 1 makes insertion of the end portion 2k of the lower case 2 easy and the engagement of the groove 1w of the upper case 1 with the end portion 2k of the lower case 2 is further facilitated as the groove 1w of the upper case 1 deforms as shown by dotted lines.

As described above and shown in FIG. 16 and FIG. 17, the lower case 2 moves upwardly in the direction A to its installation position on the upper case 1 and slides in the direction B, so that the engagement portion 23 of the rear end portion of the rear lower ⊐ shape protrusion 1f of the upper case 1 engages with notch 2f and flat portion 2j of the lower case 2. In order to disengage or disassemble the lower case 2 from the upper case 1, the lower case 2 slides along the arrow C direction and the lower case 2 stops when the end portion 21 of the rib 2e of the lower case 2 contacts with an inside of the rib 1q of the shape protrusion 1f of the upper case 1. As a result, it is possible to prevent the lower case 2 and ROM 14 mounted on the connector 14a on the bottom face of the logic package 9 from contacting each other while the lower case 2 is installed and disassembled.

In addition, the spacer 8 mounted on the bottom face of the logic package 9 prevents the lower case 2 from contacting the logic package 9 when the electric appliance is upwardly pushed.

Lastly the, whole assemblage of the electric appliance is completed by inserting a conductive member 31 through the hole 2g of the lower case 2 and threading it with the screw hole 17a of the package holder 17 of the logic package 9.

FIG. 1 to FIG. 5 show the electric appliance as assembled. In addition, the conductive member 31 intends to electrically conduct the lower case 2 to the earth of the logic package 9 through the package holder 17 but the conductive member 31 is not so important to the assemblage of the housing of the electric appliance according to the present invention. Using the conductive member 31 makes the upper and the lower cases 1 and 2 and the logic package 9 strongly binded.

Because ROM 14 is mounted on the connector 14a and on the bottom face of the logic package 9, it is easy to exchange ROM 14 only by disassembling the lower case 2.

In addition, the purpose of the recess 2d of the lower case 2 is to lessen the height of the electric appliance of the present invention by placing the bottom face of the lower case 2 on a rubber seat 32.

Figure 22:
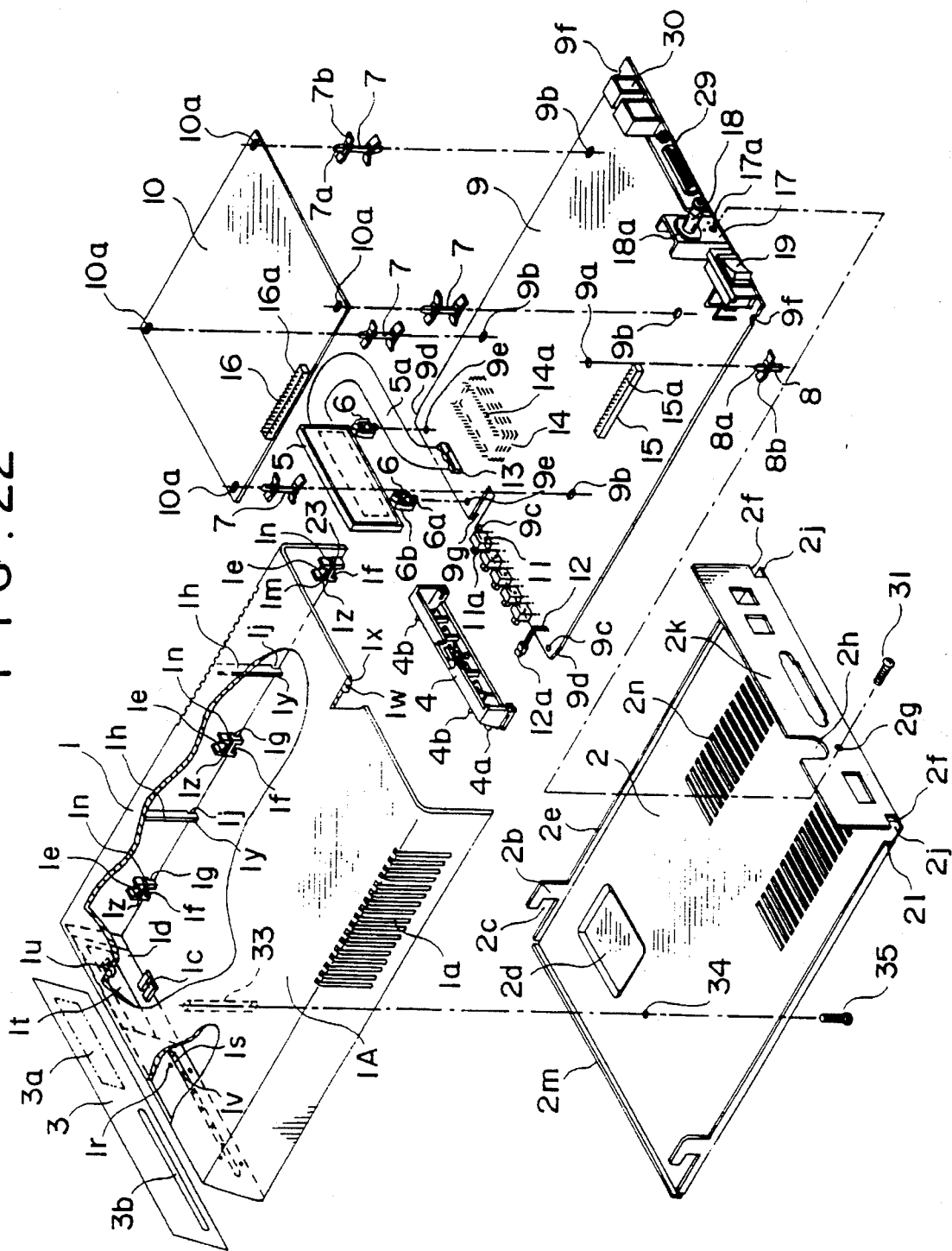
FIG. 22 is an exploded perspective of the electric appliance of another embodiment according to the present invention.

FIG. 22 shows another embodiment of the electric appliance according to the present invention. According to the embodiment above, a screw seat 33 is provided on the inner face portion of the upper face portion 1A of the upper case 1, a screw hole 34 is formed on the lower case 2, the upper and the lower cases 1 and 2 are assembled as mentioned above, and the bis 35 is threaded into the screw seat 33 through the screw hole 34 in order to make the fixing of the lower case 2 and upper case 1 sure.

Figure 23:
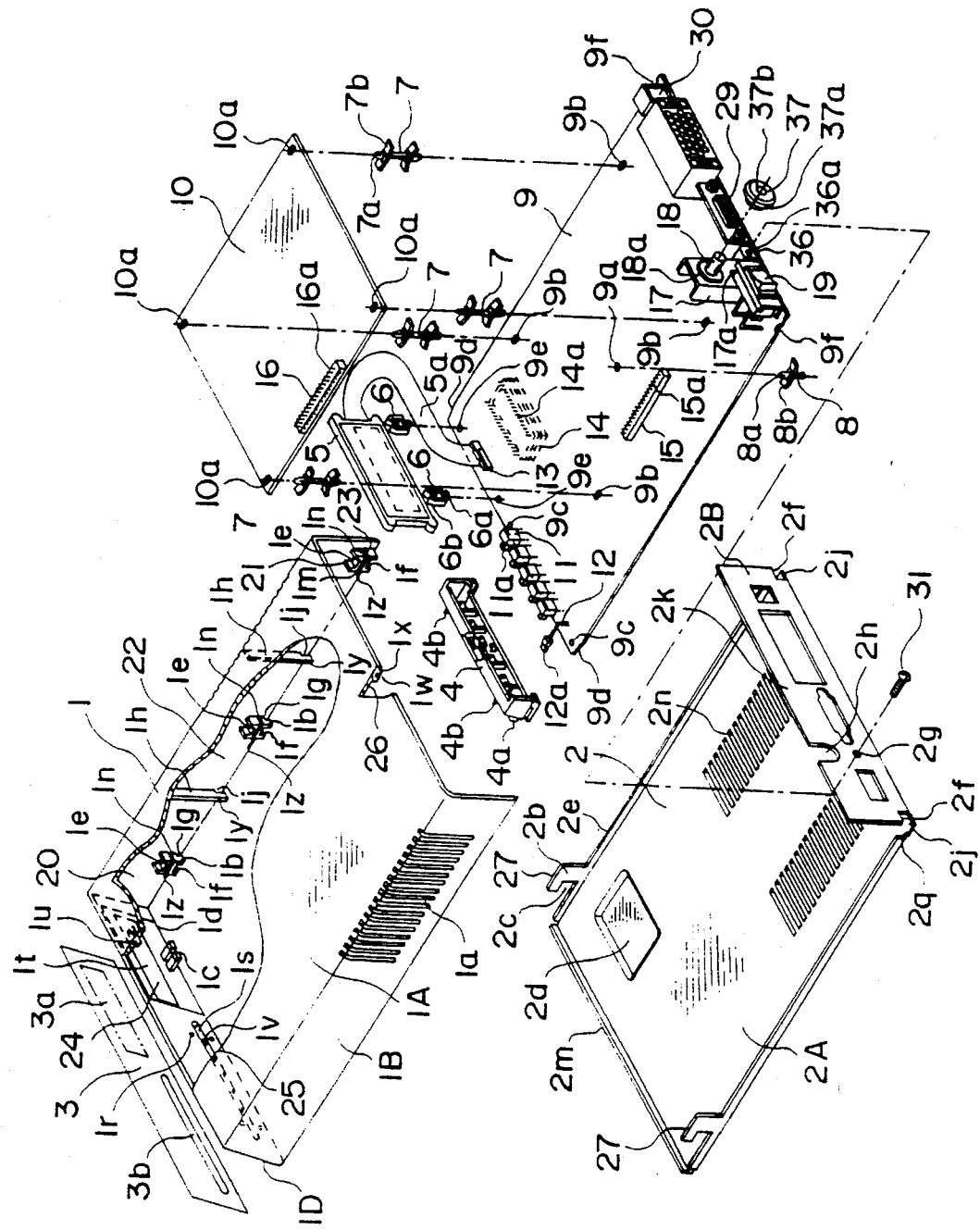
FIG. 23 is an exploded perspective of the electric appliance of still another embodiment.
Figure 24:
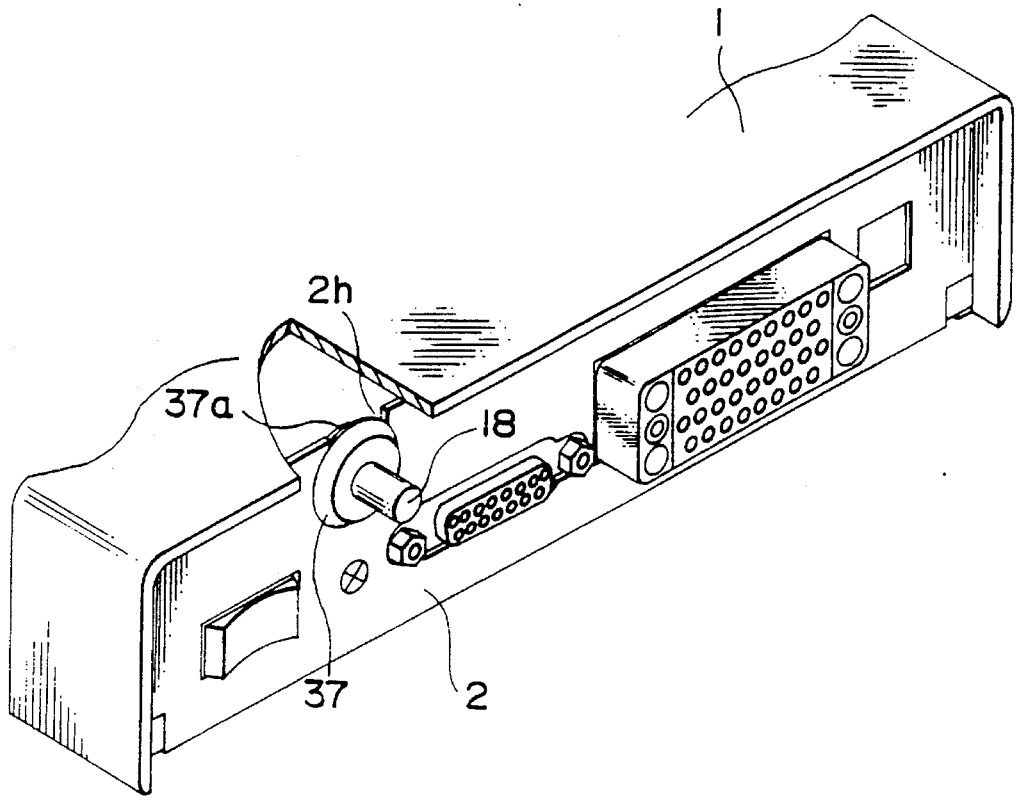
FIG. 24 is a perspective of the rear portion of the electric appliance.

FIG. 23 shows still another embodiment of the present invention. According to the embodiment, the rear edge portion of the print substrate of the logic package 9 has interface connectors 29, 30, package holder 17 having a power cable 18 secured by a cable holder 18a and mounted thereon, a power switch 19, and earth terminal 36. In this case, the rear edge portion of the print substrate has a power switch 19, earth terminal 36, connector 29, connector 30, respectively arranged in this order from the left side to the right side toward the front face of the print substrate. The package holder 17 is placed in front of the earth terminal 36. The earth terminal 36 only the functions as an earth connection and has a screw hole 36a for the function.

Figure 25:
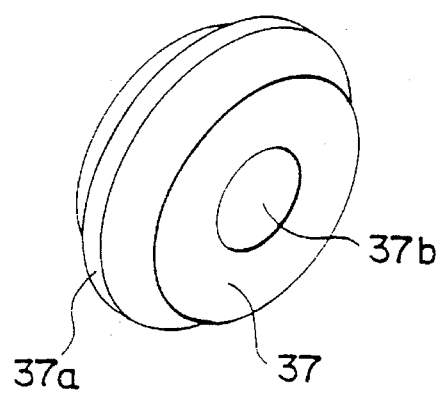
FIG. 25 is a perspective of the insulator bushing.
Figure 26:
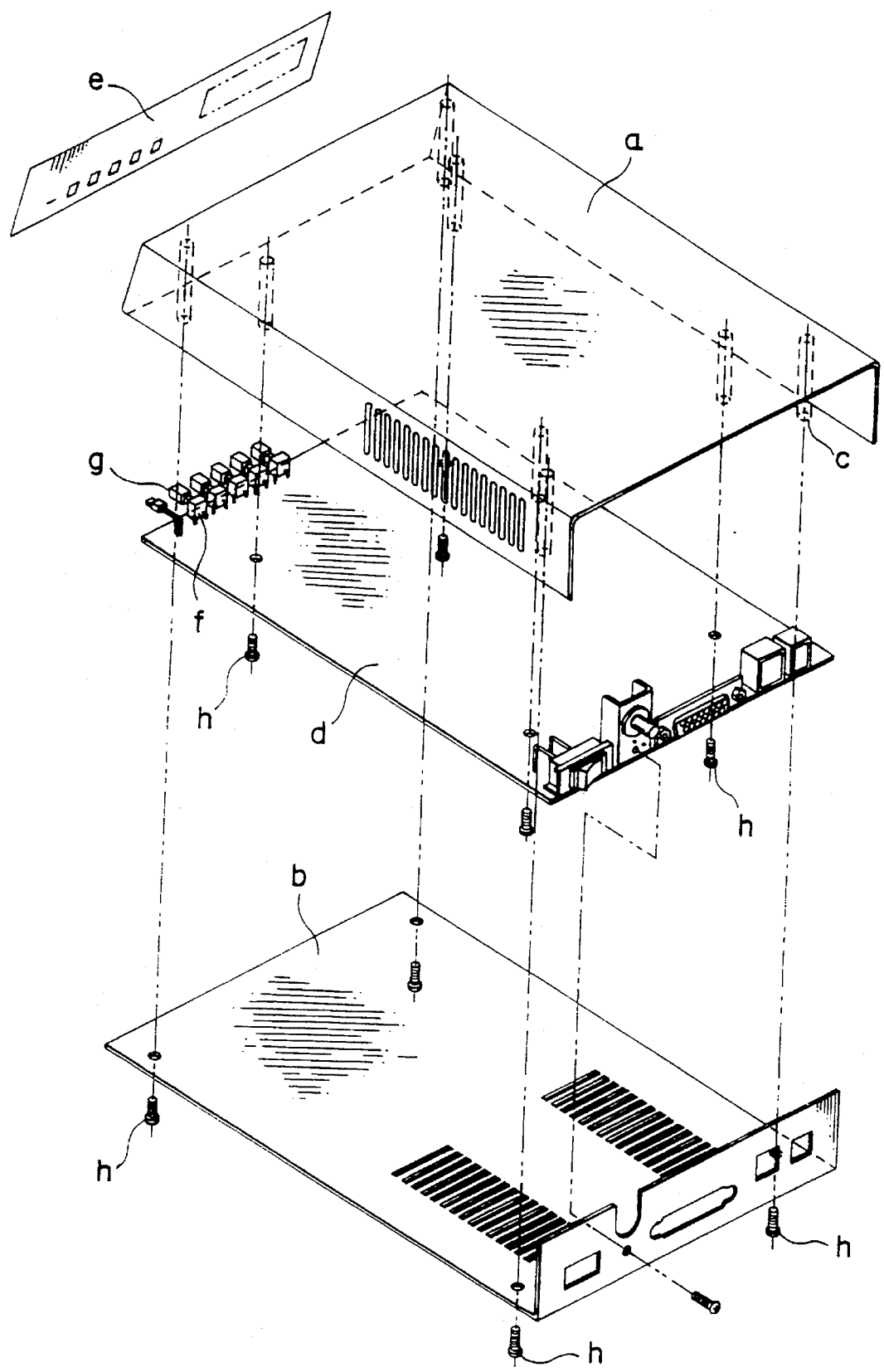
FIG. 26 is an exploded perspective of the conventional electric appliance.

The power cable 18 has an insulator bushing 37 to protect the power cable 18 from the notch 2h of the rear face portion 2B of the lower case 2. In detail, as shown in FIG. 25, the insulator bush 37 has a central hole 37b through which the cable 18 passes and a circumferential groove 37a in which an edge portion of notch 2h is inserted.

As described above, the rear portion of the logic package 9 has an interface connector 29 and the power switch 19, and the package holder 17 having the power cable 18 mounted thereon is removed leaving a vacant space. Earth terminal 36 having only the earth connection function is mounted in the space. The rear face portion of the lower case 2 has a notch 2h, and the insulator bushing 37 through which the power cable 18 passes is removably fixed to the notch 2h, so that it is possible to mount more interfaces on the logic package 9 and thereby miniaturizing the electric appliance and simplifying the assemblage and disassemblage of the appliance.

As described above, the assembling method of the electric appliance of the present invention, comprising the upper case having a plurality of logic package holding portions arranged on the inner side of the left and the right side face portions in front and rear direction at a regular interval and the upper case side engagement portion, the lower case having hooks formed at the left and the right front portions and the lower case side engagement portion, the push button unit, and the logic package, is the steps of installing the push button unit on the logic package, inserting the logic package into the upper case using a guide of the logic package holding portion and holding the package there, hooking the hook portions of the lower case on the most front logic package holding portion in order to revolve the lower case toward the upper case side and overlap the lower case upon the upper case, pushing-in the lower case in order to make the lower case side engagement portion engaged with the upper side engagement portions. As a result no screw is used contrary to the conventional method, and simplicity in the assemblage of the electric appliance and improvement of the workability of assemblage are achieved.

Additionally, the electric appliance of the present invention has the plastic upper case having a plurality of logic package holding portions arranged on the interior of the left and the right side face portions in the front and rear direction at a regular interval and the upper case side engagement portion, the conductive lower case provided with the lower case side engagement portions and hooks arranged on the left and the right front portions, the hooks being hooked on the most front logic package holding portion in order to turn lower case toward the upper case side and to overlap it on the upper case and to push the lower case resulting in an engagement of the lower case side engagement portion with the upper case side engagement portion, a logic package to be inserted in the upper case using a guide of the logic package holding portion and secured there, and a push button unit removably installed on the logic package, so that it is possible to easily disassemble to upper case, lower case, and the logic package and to sort them according to the kind of material thereby simplifying waste treatment of the electric appliance.

In addition, the housing structure of the electric appliance of the present invention has the upper case provided with a plurality of logic package holding portions arranged on the interior of the left and the right side face portions in the front and rear direction at a regular interval and the upper case side engagement portion, the lower case provided with the lower case side engagement portions and hooks arranged on the left and the right front portions, the hooks being hooked on the most front logic package holding portion in order to turn the lower case toward the upper case side and to overlap lower case on the upper case and to push the lower case resulting in an arrangement of the lower case side engagement portion with the upper case side engagement portion, so that it is possible to carry out assemblage and disassembling operation of the housing of the electric appliance and improve assemblage and disassemblage workability.

Additionally, in the housing structure of the electric appliance, the logic package holding portion formed on the interior faces of the left and the right side portions has a horizontal groove through which the side edge portion of the logic package is inserted. The upper case side engagement portion at least protrudes rearward toward the under side portion of the rear logic package holding portion, and the lower case side engagement portion is provided on an L shape or curved portion format at a rear face portion of the lower case, wherein the upper case side engagement portion is an engagement hole adapted to engage with the engagement portion when the lower case is matched with upper case. The hooks are L shape protrusions having notches to be hooked on the front logic package holding portion, so that when the side edge portion of the logic package is forcibly inserted in the groove of the logic package holding portion, it is easy to assemble the logic package to the upper case. The L shape protrusions of the hooks are hooked on the front logic package holding portion, and engagement hole of the lower case side engagement portion engages with the engagement portion of the upper case side engagement portion in order to carry out assemblage of the upper and the lower cases and improve assemblage and disassemblage workability of the housing.

According to the electric appliance of the present invention, the liquid crystal indicator fits into the stepped portion of the opening, and the upper portion of the liquid crystal indicator engages with the upper protrusion. The lower portion of the liquid crystal indicator engages with the lower protrusion in order to prevent up and down direction movement and right and left direction movement of the indicator. A pressing member mounted on the logic package presses the rear face of the liquid crystal indicator in order to hold the indicator preventing its rearward movement. As a result, no screw is used thereby simplifying a fixing of the liquid crystal indicator and improving its assemblage workability.

Additionally, according to the electric appliance, the fixing structure of the liquid crystal indicator has a resilient holding member pressing against the rear face of the liquid crystal indicator, so that no screws are used, and the liquid crystal indicator can be easily held and shock applied to the liquid crystal indicator when the electric appliance is handled easily absorbed.

According to the electric appliance of the present invention, the case has a push button switch installation portion provided with a push button switch portion, the logic package having a plurality of electric keys arranged its front edge portion has engagement portions, wherein the push button unit has a plurality of push buttons arranged on the front face portion of the case main body in right and left direction. These push buttons are attached to the case main body through resilient push button connection pieces, and the case main body has engagement portions adapted to engages with the logic package engagement holes, the engagement portion engage with the engagement holes of the logic package and the push button unit is installed on the front edge portion of the logic package in order to contact the front ends of the electric keys to the back of the push button such that pushing-in of the logic package makes the push button switch portion installed in the push button switch installation portion of the case. As a result, the push button switch portion is structured by engaging the engaging portion with the engagement holes of the logic package, installing the push button unit on the front edge portion of the logic package, making the front ends of the electric keys contact the back face of the push button, and pushing-in the logic package so as to install the push button switch portion onto the push button switch installation portion of the case. As a result, it is possible to confirm whether the push button switch portion is completely structured after only the push button switch portion is assembled before the whole construction of the appliance, and thereby improving the assemblage workability.

Additionally, according to the push button switch structure of the electric appliance, because the pillars are provided at positions at the rear of an between the push buttons of the case main body of the push button unit, the interior of the electric appliance is not seen through gaps between push buttons. The view is hindered by the pillars when the push button unit is seen from the front face of the electric appliance, and also no light is seen from the outside when electric globe and light emission diodes are lit in the interior of the electric appliance, thereby improving the product quality and strengthening the push button unit by means of reinforcement rib function of the pillars.

According to the push button structure of the electric appliance, the push button unit installation portion has oval holes for accommodating the push buttons and additional holes placed above and below the oval holes, and a front face portion of the case main body of the push button unit has protrusions adapted to engage with the holes of upper case. The engagement portions of the case main body are structured by cantilever engagement pieces, grooves accommodating front end portions of the logic package, and protrusions formed at front end portions of the engagement pieces so as to engage with the engagement holes of the logic package and provided with its slanted end portion. Consequently, it is possible to easily structure the push button switch portion, while installing the push button unit on the logic package, by inserting the edge portions of the logic package into the grooves by a predetermined length, engaging the protrusions formed at the front end portion of the engagement piece with the engagement hole portions of the logic package. The result is a fixed positional relationship of the push buttons and the electric keys.

Further, engagement of the protrusions of the push button unit with the holes of the case confirms a fixing of the push button unit to the upper case.

Additionally, according to the push button switch structure of the electric appliance, the push button unit installation portion is constructed by oval holes accommodating the push buttons, a plurality of protrusions arranged on the upper and the lower face portions of the oval holes at a regular interval, and holes formed above and below the oval holes. The push button unit is structured by a plurality of push buttons arranged on the front face of the case main body in right and left direction, the push buttons being attached to the case main body through resilient push button connection pieces, stoppers adapted to contact with edge portions of the oval holes when the push button unit is installed in the upper case, and engagement portions formed in the case main body so as to engage with the engagement holes of the logic package. As a result, when the push button unit engages with the case, the plurality of protrusions formed on the upper and the bottom faces of the oval holes at a regular interval prevent the push buttons from mutually contacting when the push button switch portion is operated. In addition the stoppers formed on the push buttons contact with the edge portion of the oval hole when the push button unit is installed on the upper case and prevent the plural front ends of the push buttons from being uneven, making operation of the push button switch portion good.

As described above, the electric appliance of the present invention has a plastic upper case provided with a plurality of logic package holding portions arranged on the inner side of the left and the right side face portions in front and rear direction at a regular interval, as well as upper case side engagement portions, a conductive lower case having lower case side engagement portions and the left and the right front hooks, the hooks being adapted to hook on the most front logic package holding portion and the lower case being turned to upper case side and overlapped on the upper case and pushed into the upper case in order to make the lower case side engagement portion engaged with the upper case side engagement portion, the logic package adapted to insert and be held in the upper case using the logic package holding portion as a guide for insertion, and a connector and power switch interfaces which are placed at the rear of the logic package. Furthermore, the package holder securing and mounting power cable is removed leaving a space in which an earth terminal having only an earth connection function. The rear face portion of the lower case has a notch, and an insulator bushing through which power cable passes is removably attached to the notch, and as a result, no screw is used in the housing structure contrary to the conventional housing which employs fastening screws. As a result easy assemblage of electric appliance and improved workability of assemblage is achieved. Further, is possible to mount more interfaces on the logic package, to miniaturize the electric appliance, and to simplify its assemblage and disassemblage.

What is claimed is:

1. A method of assembling an electric appliance having an upper case provided with a plurality of logic package holding portions arranged on inner sides of left and right side face portions of the upper case at a regular interval and an upper case side engagement means and a screw seat arranged on an interior portion of the upper case a lower case provided with hooks formed at front portions of left and right sides of the lower case and a lower case side engagement means and a screw hole formed on the bottom face portion of the lower case and a logic package, said method comprising steps of:

inserting the logic package into grooves formed on said logic package holding portions of said upper case;

hooking the hooks of the lower case to respective logic package holding portions so as to arrange the lower case slidable and rotatable with respect to the upper case;

positioning the lower case to overlap with the upper case by rotating the lower case about the hooks; and pushing the lower case forward and against the upper case so as to engage the lower case side engagement means with the upper case side engagement means and so as to match the screw hole to the screw seat and threading a screw into the screw seat through the screw hole, so that the upper case is fixed to the lower case.

2. The method of assembling an electric appliance according to claim 1, wherein the electric appliance further comprises a push button unit and said method further comprises the step of installing the push button unit on the logic package.

3. The method of assembling an electric appliance according to claim 1, wherein said upper case side engagement means is located on a central and rear interior portion of the upper case, and said lower case side engagement means is an edge portion of a rear face of the lower case, such that the edge portion of the rear face of the lower case engages with the upper case side engagement means located on the central and rear interior portion of the upper case.

4. The method of assembling an electric appliance according to claim 2, wherein said upper case side engagement means is located on a central and rear interior portion of the upper case, and said lower case side engagement means is an edge portion of a rear face of the lower case, such that the edge portion of the rear face of the lower case engages with the upper case side engagement means located on the central and rear interior portion of the upper case.

5. The method of assembling an electric appliance according to claim 1, wherein said upper case side engagement means is located at a rear interior of the left and right side face portions of the upper case, and said lower case side engagement means is a hole formed on a rear face of the lower case, such that the hole engages with the engagement means located at a rear interior of the left and right side face portions of the upper case.

6. The method of assembling an electric appliance according to claim 2,
wherein said upper case side engagement means is located at a rear interior of the left and right side face portions of the upper case, and said lower case side engagement means is a hole formed on a rear face of the lower case, such that the hole engages with the engagement means located at a rear interior of the left and right side face portions of the upper case.

7. An electric appliance comprising:
a plastic-made upper case provided with a plurality of logic package holding portions located inside of left and right side face portions of the upper case at a regular interval and an upper case side engagement means and a screw seat arranged on an interior portion of the upper case;
a conductive lower case having a lower case side engagement means and a screw hole formed on the bottom face portion of the lower case left and right front hooks, said hooks being adapted to hook the logic package holding portions in order to position the lower case to overlap with the upper case such that pushing the lower case forward and against the upper case results in an engagement of the lower case side engagement means with the upper case side engagement means and said screw hole being matched to the screw seat so as to thread a screw into the screw seat through the screw hole; and
a logic package insertable in said logic package holding portions to be held in the upper case.

8. The electric appliance according to claim 7, further comprising a push button unit removably installed on the logic package.

9. The electric appliance according to claim 7, wherein said upper case side engagement means is located on a central and rear interior portion of the upper case, and said lower case side engagement means is an edge portion of a rear face of the lower case, such that the edge portion of the rear face of the lower case engages with the upper case side engagement means located on the central and rear interior portion of the upper case.

10. The electric appliance according to claim 8, wherein said upper case side engagement means is located on a central and rear interior portion of the upper case, and said lower case side engagement means is an edge portion of a rear face of the lower case, such that the edge portion of the rear face of the lower case engages with the upper case side engagement means located on the central and rear interior portion of the upper case.

11. The electric appliance according to claim 7, wherein said upper case side engagement means is located at a rear interior of the left and right side face portions of the upper case, and said lower case side engagement means is a hole formed on a rear face of the lower case, such that the hole engages with the engagement means located at a rear interior of the left and right side face portions of the upper case.

12. The electric appliance according to claim 8, wherein said upper case side engagement means is located at a rear interior of the left and right side face portions of the upper case, and said lower case side engagement means is a hole formed on a rear face of the lower case, such that the hole engages with the engagement means located at a rear interior of the left and right side face portions of the upper case.

13. A housing structure of an electric appliance comprising:
an upper case provided with a plurality of logic package holding portions arranged inside of left and right side face portions of the upper case at a regular interval and an upper case side engagement means and a screw seat arranged on an interior portion of the upper case;
a lower case provided with a lower case side engagement means and a screw hole formed on the bottom face portion of the lower case and left and right front hooks, said hooks being adapted to hook the logic package holding portions in order to position the lower case to overlap with the upper case such that pushing the lower case forward and against the upper case results in an engagement of the lower case side engagement means with the upper case side engagement means, and the screw seat being matched to the screw hole so as to thread a screw into the screw seat through the screw hole.

14. The housing structure of an electric appliance according to claim 13,
wherein said upper case side engagement means is located on a central and rear interior portion of the upper case, and said lower case side engagement means is an edge portion of a rear face of the lower case, such that the edge portion of the rear face of the lower case engages with the upper case side engagement means located on the central and rear interior portion of the upper case.

15. The housing structure of an electric appliance according to claim 13, wherein said upper case side engagement means is located at a rear interior of the left and right side face portions of the upper case, and said lower case side engagement means is a hole formed on a rear face of the lower case, such that the hole engages with the engagement means located at a rear interior of the left and right side face portions of the upper case.

16. The housing structure of an electric appliance according to claim 13, wherein
said logic package holding portions has horizontal grooves in which side edge portions of the logic package is inserted,
said upper case side engagement means is a protrusion formed by rearwardly extending a bottom side of a rear-most logic package holding portion,
said lower case side engagement means is an engagement hole formed on an-L shaped portion of a rear face of the lower case, and is adapted to engage with the upper case side engagement means when the lower case is matched to the upper case, and
said hooks are L-shaped protrusions having notches adapted to be hooked on a front-most logic package holding portion.

17. A housing structure of an electric appliance comprising:
an upper case having an upper case engagement means and a plurality of logic package holding portions located inside of left and right side face portions of the upper case;

a logic package insertable in said logic package holding portions; and a lower case having a lower case side engagement means and a left and a right hook adapted to engage with a left and a right logic package holding portion and a screw hole formed on the bottom face portion of the lower case;

wherein said lower case rotates about said hooks to overlap with the upper case such that pushing the lower case forward and against the upper case results in an engagement of the lower case side engagement means and the screw seat is matched to the screw hole so as to thread a screw into the screw seat through the screw hole.

18. The housing structure of an electric appliance according to claim 17, wherein said upper case side engagement means is located on a central and rear interior edge of the upper case and includes a recessed portion and a chamfered edge, and said lower case side engagement means is an edge portion of a rear face of the lower case, such that the edge portion of the rear face of lower case slides against the chamfered edge and engages with the recessed portion.

19. The housing structure of an electric appliance according to claim 17, wherein said logic package holding portions have horizontal grooves in which side edge portions of said logic package is inserted.

* * * * *